United States Patent
Ju

(10) Patent No.: US 12,106,689 B2
(45) Date of Patent: Oct. 1, 2024

(54) DISPLAY DEVICE AND TEST METHOD THEREOF

(71) Applicant: Samsung Display Co., LTD., Yongin-si (KR)

(72) Inventor: Sung Bae Ju, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 607 days.

(21) Appl. No.: 16/931,100

(22) Filed: Jul. 16, 2020

(65) Prior Publication Data

US 2021/0134197 A1    May 6, 2021

(30) Foreign Application Priority Data

Oct. 30, 2019  (KR) .......................... 10-2019-0136865

(51) Int. Cl.
 *G09G 3/00* (2006.01)
 *H01L 27/32* (2006.01)
 *H10K 59/131* (2023.01)

(52) U.S. Cl.
 CPC ........... *G09G 3/006* (2013.01); *H10K 59/131* (2023.02)

(58) Field of Classification Search
 CPC .......................... G09G 3/006; G09G 2330/12; H01L 27/3276; H01L 51/0097; H01L 51/56; H01L 27/3218; H01L 22/34; H01L 27/3216; H01L 27/3246; H01L 27/3248; H01L 27/3262; H01L 27/3279; H01L 51/0031; H05B 45/50; H05B 45/60
 USPC ...................................................... 324/750.3
 See application file for complete search history.

(56) References Cited

U.S. PATENT DOCUMENTS

| | | | |
|---|---|---|---|
| 11,011,085 B2 * | 5/2021 | Lee | H10K 59/131 |
| 2013/0257794 A1 | 10/2013 | Lee et al. | |
| 2014/0002090 A1 * | 1/2014 | Wu | G01R 31/44 |
| | | | 324/414 |
| 2014/0098005 A1 * | 4/2014 | Kim | H01L 22/34 |
| | | | 345/1.3 |
| 2014/0353671 A1 * | 12/2014 | Choi | H01L 22/14 |
| | | | 257/72 |
| 2016/0268352 A1 * | 9/2016 | Hong | H10K 59/88 |
| 2016/0320878 A1 | 11/2016 | Hong et al. | |
| 2018/0107080 A1 | 4/2018 | Chan et al. | |

(Continued)

FOREIGN PATENT DOCUMENTS

| CN | 103364983 A | 10/2013 |
|---|---|---|
| CN | 104218067 A | 12/2014 |

(Continued)

OTHER PUBLICATIONS

Partial European Search Report-European Application No. 20197963.0 dated Mar. 3, 2021.

(Continued)

*Primary Examiner* — Thang X Le
*Assistant Examiner* — Haidong Zhang
(74) *Attorney, Agent, or Firm* — CANTOR COLBURN LLP

(57) ABSTRACT

A display device includes a substrate in which a cut-out portion is defined, and a first conductive layer disposed on the substrate and including a first signal line and a first test line, where the first test line crosses the cut-out portion, and one end portion of the first test line includes a first pad region that is expanded.

16 Claims, 18 Drawing Sheets

(56) References Cited

U.S. PATENT DOCUMENTS

| | | |
|---|---|---|
| 2018/0174523 A1 | 6/2018 | Jeon et al. |
| 2018/0218658 A1 | 8/2018 | Kim et al. |
| 2018/0350701 A1 | 8/2018 | Kim et al. |
| 2018/0364838 A1 | 12/2018 | Hong et al. |
| 2019/0064958 A1* | 2/2019 | Liu .................... G06F 3/0446 |
| 2019/0074332 A1* | 3/2019 | Kim .................. H01L 27/3276 |
| 2019/0107911 A1 | 4/2019 | Zhai |
| 2021/0005701 A1 | 1/2021 | Matsui et al. |
| 2021/0049939 A1* | 2/2021 | Sui ...................... G09F 9/301 |

FOREIGN PATENT DOCUMENTS

| | | |
|---|---|---|
| CN | 105632959 A | 6/2016 |
| CN | 105977276 A | 9/2016 |
| CN | 108206005 A | 6/2018 |
| CN | 109427258 A | 3/2019 |
| CN | 109920334 | 6/2019 |
| CN | 110444575 A | 11/2019 |
| CN | 109923676 B | 12/2022 |
| JP | 2008096760 A * | 4/2008 |
| WO | 2019167279 | 9/2019 |

OTHER PUBLICATIONS

Extended European Search Report-European Application No. 20197963.0 dated Jul. 6, 2021.

* cited by examiner

000
DISPLAY DEVICE AND TEST METHOD THEREOF

This application claims priority to Korean Patent Application No. 10-2019-0136865 filed on Oct. 30, 2019, and all the benefits accruing therefrom under 35 U.S.C. § 119, the content of which in its entirety is herein incorporated by reference.

BACKGROUND

1. Field

Exemplary embodiments of the invention relate to a display device and a test method thereof, and more particularly, to a stretchable display device capable of being expanded and contracted and a test method thereof.

2. Description of the Related Art

An importance of display devices is increasing with a development of multimedia. Accordingly, various types of display devices such as an organic light-emitting display ("OLED") device or a liquid crystal display ("LCD") device are being used.

Recently, a demand for flexible display devices is increasing. Among the flexible display devices, stretchable display devices capable of being expanded and contracted have wide application ranges. The stretchable display devices may be utilized as display devices intended to be stretched but may also be applied to other flexible display devices, foldable display devices, and rollable display devices for effective bending, folding, and rolling.

SUMMARY

When a display device is stretched, not only a substrate, but also lines disposed thereon may be stressed. The stress of the substrate may be reduced by cutting out a portion of the substrate. In the case of the lines disposed on the substrate, the stress may be released by changing constituent materials or patterns, but the stress due to the stretching is concentrated in the portions of the lines passing through the cut-out portion as compared with other portions of the lines, and the lines may be disconnected in some cases. The disconnection of the lines leads to display defects of the display device. However, the display defects may occur due to various causes and thus it is difficult to trace the exact causes only by confirming the display defects. In addition, the display device includes a plurality of transistors for driving a pixel circuit, and the display defects occur when the characteristic values of the corresponding transistor are not uniform. However, it may be difficult to accurately identify which positions of the transistors in the display area have different characteristic values with only the display defects.

Exemplary embodiments of the invention provide a display device in which whether a conductive layer is disconnected may be easily confirmed.

Exemplary embodiments of the invention also provide a display device in which the characteristic values of a transistor and a corresponding position in a display area are easily confirmed.

Exemplary embodiments of the invention also provide a test method of a display device in which whether a conductive layer is disconnected may be easily identified.

It should be noted that features and advantages of the invention are not limited to the above-described objects, and other features and advantages of the invention will be apparent to those skilled in the art from the following descriptions.

An exemplary embodiment of a display device includes a substrate in which a cut-out portion is defined, and a first conductive layer disposed on the substrate and including a first signal line and a first test line, where the first test line crosses the cut-out portion, and one end portion of the first test line includes a first pad region that is expanded.

Another exemplary embodiment of a device includes a substrate including a display area including a plurality of pixels, a plurality of pixel circuit transistors and a test transistor that are disposed on the substrate, and a pixel electrode connected to at least some of the plurality of pixel circuit transistors and provided for each of the plurality of pixels, where the test transistor is disposed in the display area, the test transistor has a same layered structure as that of the pixel circuit transistor and further includes a contact electrode including a material of the pixel electrode, and the contact electrode includes a gate contact electrode connected to a gate electrode of the test transistor, a first source/drain contact electrode connected to a first source/drain electrode of the test transistor, and a second source/drain contact electrode connected to a second source/drain electrode of the test transistor.

An exemplary embodiment of a test method of a display device, includes forming a first conductive layer including a first signal line and a first test line on a substrate in which a cut-out portion is defined such that the first test line crosses the cut-out portion and includes a first pad region including one end portion expanded, and measuring a resistance of the first test line.

In the exemplary embodiments, whether a conductive layer is disconnected may be easily confirmed. Further, the characteristic values of a transistor and a corresponding position in a display area may be easily confirmed.

Effects in the exemplary embodiments of the invention are not limited by the content exemplified above, and more various effects are included in the specification.

BRIEF DESCRIPTION OF THE DRAWINGS

The above and other exemplary embodiments and features of the invention will become more apparent by describing exemplary embodiments thereof in detail with reference to the attached drawings, in which.

DETAILED DESCRIPTION

Figure 1:
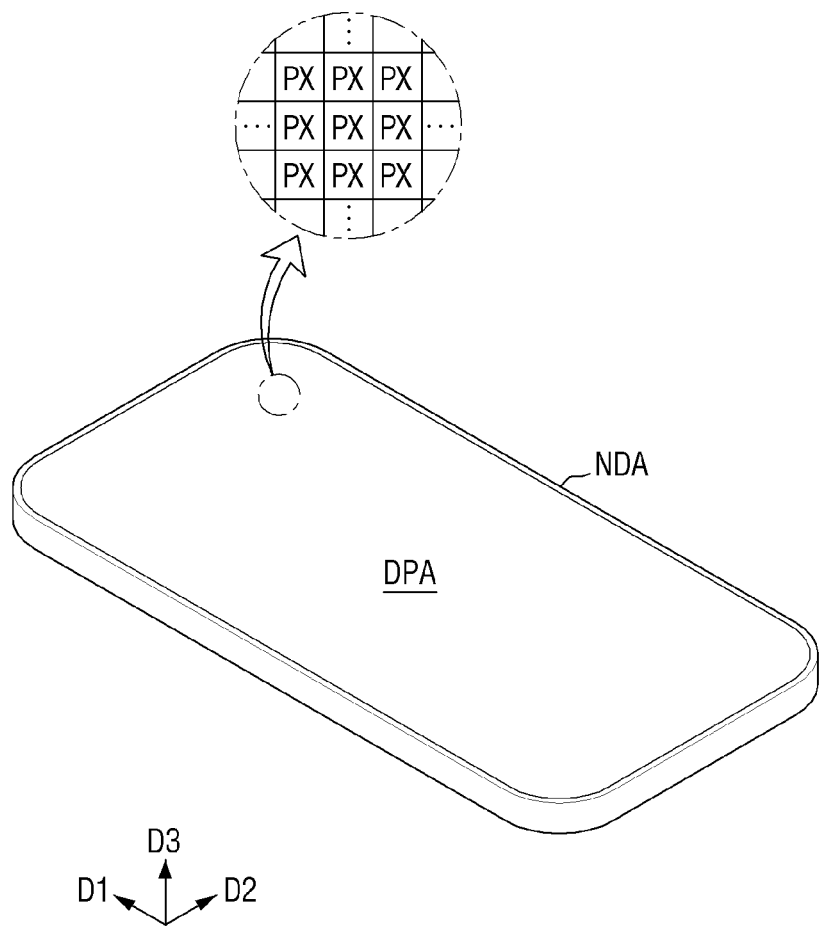
FIG. 1 is a perspective view of an exemplary embodiment of a display device.

The invention will now be described more fully hereinafter with reference to the accompanying drawings, in which preferred embodiments of the invention are shown. This invention may, however, be embodied in different forms and should not be construed as limited to the exemplary embodiments set forth herein. Rather, these embodiments are provided so that this invention will be thorough and complete, and will fully convey the scope of the invention to those skilled in the art.

It will also be understood that when a layer is referred to as being "on" another layer or substrate, it may be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. In an exemplary embodiment, when the device in the drawing figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

The same reference numbers indicate the same components throughout the specification.

Hereinafter, exemplary embodiments of the invention will be described with reference to the accompanying drawings.

FIG. 1 is a perspective view of an exemplary embodiment of a display device. Throughout the specification, a first direction D1 and a second direction D2 refer to directions crossing each other. A third direction D3 is a direction perpendicular to a plane in which the first direction D1 and the second direction D2 are placed and indicates a thickness direction. It is illustrated in the drawings that the first direction D1 indicates a longitudinal direction in a plan view and the second direction D2 indicates a horizontal direction in a plan view, but the invention is not limited thereto.

Referring to FIG. 1, a display device 10 displays a video or a still image and includes a display panel. Examples of the display panel include self-emissive display panels such as an organic light-emitting display ("OLED") panel, an inorganic electro-luminescence ("EL") display panel, a quantum dot light-emitting display ("QLED") panel, a micro light-emitting display ("LED") panel, a nano LED panel, a plasma display panel ("PDP"), a field emission display ("FED") panel, and a cathode ray tube ("CRT") display panel as well as light-receiving display panels such as a liquid crystal display ("LCD") panel and an electrophoretic display ("EPD") panel. Hereinafter, the OLED panel will be described as an exemplary embodiment of the display panel, and unless a particular distinction is desired, the OLED panel applied to exemplary embodiments will be simply referred to as the display panel. However, the invention is not limited to the OLED panel, and other display panels listed above or known in the art may be applied to the display panel to the extent that technical ideas are shared.

The display device may further include a touch member. The touch member may be integrated with the display panel or may be provided as a separate panel from the display panel.

The display device 10 may further include a sensor, various controllers, a housing, and other components in addition to the display panel and the touch member. Any device that includes a display area DPA which displays an image or a video may be interpreted as corresponding to the display device 10 regardless of the main use, an added function, a name, and the like of the device. In exemplary embodiments, the display device 10 may include, but is not limited to, a smartphone, a mobile phone, a tablet personal computer ("PC"), a personal digital assistant ("PDA"), a portable multimedia player ("PMP"), a television, a gaming machine, a wrist-watch type electronic device, a head-disposed (e.g., mounted) display, a monitor of a PC, a notebook computer, a car navigation system, a car dashboard, a digital camera, a camcorder, an external advertisement board, an electric signboard, various medical devices, various inspection devices, various household appliances such as a refrigerator, a washing machine, or the like that includes a display part, an Internet of Things ("IoT") device, and the like.

The display device 10 may include the display area DPA and a non-display area NDA. The display area DPA may be an active area that is an area in which an image is displayed, and the non-display area NDA may be an inactive area that is an area in which the image is not displayed. The display area DPA may have a rectangular planar shape, but the invention is not limited thereto, and the display area DPA may have various planar shapes such as a square shape, a rhombus shape, a circular shape, and an elliptical shape. The non-display area NDA may be disposed around the display area DPA. The non-display area NDA may completely or partially surround the display area DPA. Signal lines, through which signals are applied to the display area DPA or signals detected in the display area DPA are transmitted, may be disposed in the non-display area NDA. The non-display area NDA, which is an inactive area, may correspond to a bezel area of the display device 10. Although the non-display area NDA is illustrated in the drawings as being disposed around all sides of the display area DPA having a rectangular shape, the invention is not limited thereto, and the non-display area NDA may not be disposed around some sides of the display area DPA or may be shown to be omitted in a plan view in such a manner that the non-display area NDA is bent to a rear surface of the display area DPA and overlaps the display area DPA in a thickness direction.

The display area DPA includes a plurality of pixels PX. The pixels PX are arranged in a matrix form. The pixels PX may include a first color pixel, a second color pixel, and a third color pixel. In an exemplary embodiment, the first color pixel may be a red pixel, the second color pixel may be a green pixel, and the third color pixel may be a blue pixel, for example. In one exemplary embodiment, the arrangement of the pixels PX may be performed in a stripe arrangement manner in which the pixels of the same color are arranged along a first direction D1, which is a column extension direction, and the red pixel, the green pixel, and the blue pixel are alternately arranged along a second direction D2, which is a row extension direction, in the order of the red pixel, the green pixel, and the blue pixel, but the arrangement of the pixels PX is not limited to the illustrated example. In an exemplary embodiment, the arrangement of the pixels PX may be performed in a pentile arrangement manner in which each of the pixels PX is provided in a rhombus shape, and the red pixel and the blue pixel are arranged radially around the green pixel, for example. In addition, the pixels PX may further include a white pixel in addition to the red, green, and blue pixels.

The display device 10 may be a flexible device. The display device 10 may be stretchable, flexible, bendable, foldable, or rollable. Such flexibility of the display device 10 may be implemented through a flexible substrate. The flexible substrate may include a flexible polymer. In an exemplary embodiment, the flexible polymer may include a polymer including at least one of polyimide or polyester (for example, polyethylene terephthalate, polybutylene phthalate, polyethylene naphthalate, or the like), polystyrene, polycarbonate, polyether sulfone, polyarylate, polyimide, polycycloolefin, norbornen resin, poly(chlorotrifluoroethylene), polymethyl methacrylate, for example.

Figure 2:
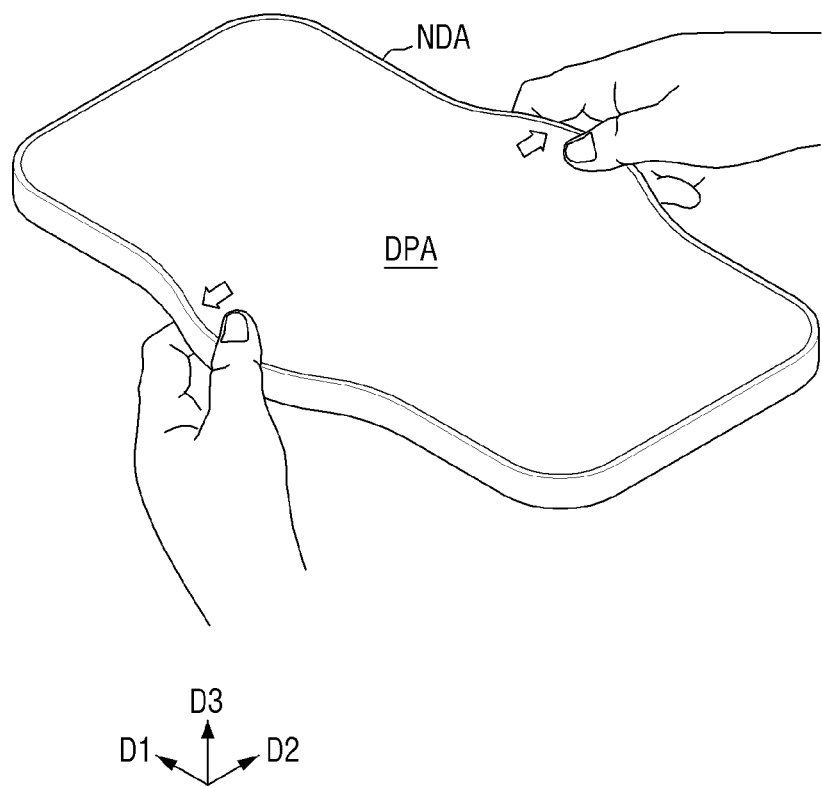
FIG. 2 is a perspective view illustrating a state in which the display device of FIG. 1 is stretched in a horizontal direction.
Figure 3:
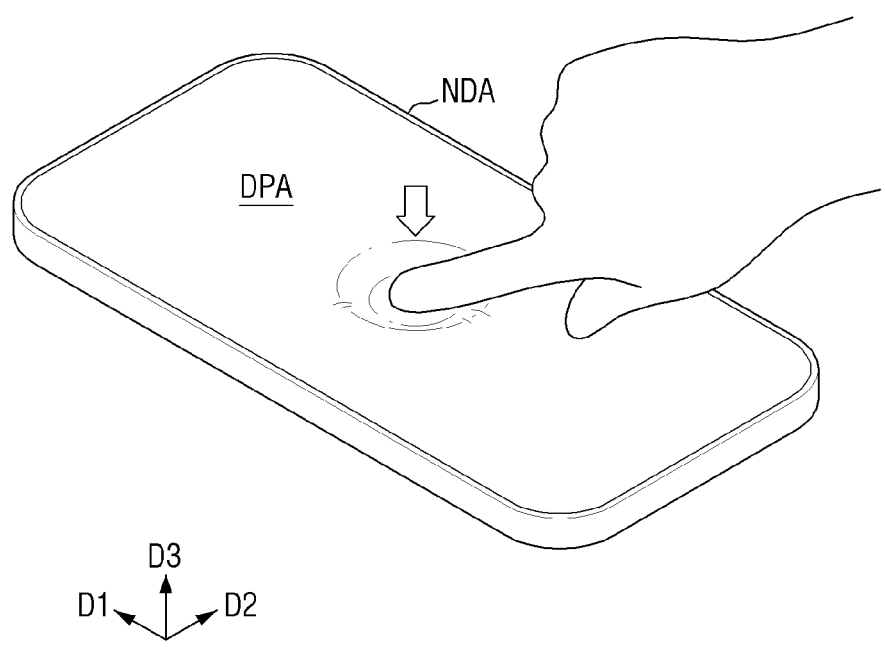
FIG. 3 is a perspective view illustrating a state in which the display device of FIG. 1 is locally stretched.

As an example of the flexible display device, an application example of the stretchable display device is illustrated in FIGS. 2 and 3.

FIG. 2 is a perspective view illustrating a state in which the display device of FIG. 1 is stretched in a horizontal direction.

Referring to FIG. 2, the display device 10 may be expanded in the horizontal direction. In an exemplary embodiment, when the vicinities of both edges of the display device 10 are grasped and stretched in directions away from both edges, the display device may be expanded in the stretched directions, for example. As the display device 10 is expanded, the area of the display device 10 in a plan view may increase. In the drawing, although the display device 10 is illustrated as being expanded in the second direction D2, the display device 10 may be expanded in the first direction D1, in both the first direction D1 and the second direction D2, or in another horizontal direction. The display device 10 may be expanded by an external force and may be contracted when the external force is removed to return to an original state thereof.

FIG. 3 is a perspective view illustrating a state in which the display device of FIG. 1 is locally stretched. Referring to FIG. 3, the display device 10 may be locally expanded while an overall planar area is maintained. That is, as illustrated in the drawing, when the display device 10 is pressed in the third direction D3, which is a thickness direction, the display device 10 may be locally expanded with respect to the pressed point. In this case, the direction in which the display device 10 is expanded becomes a direction inclined with respect to the horizontal direction, and the overall planar area of the display device 10 may be maintained to be equal to that before being expanded. Once the pressing force is removed, the portion that was expanded may be contracted again to return to the original state.

The expanding in FIG. 2 and the expanding in FIG. 3 may be performed simultaneously. In an exemplary embodiment, not only the planar area is locally increased in the direction inclined with respect to the horizontal direction against the pressure in the thickness direction, but also the overall planar area may be further increased, for example.

Figure 4:
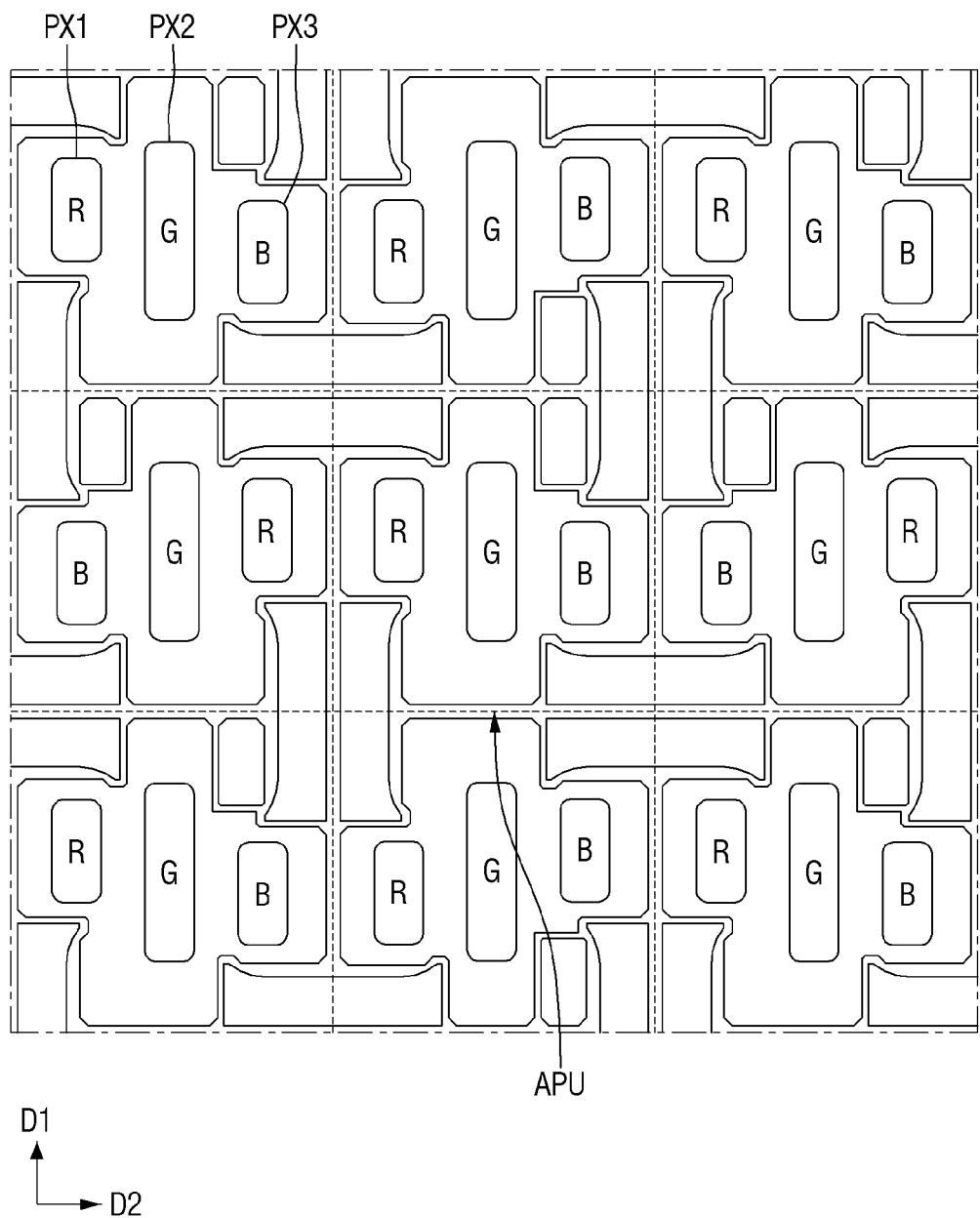
FIG. 4 is a schematic view illustrating an exemplary embodiment of an arrangement of islands of a substrate in a partial region of the display device.

As described above, when the display device 10 is stretched or contracted, the substrate of the display device 10 and thin films disposed thereon are stressed. In order to release such stretching stress, the substrate of the display device 10 may include cut-out portions. Reference is made to FIG. 4 for a detailed description thereof.

Figure 5:
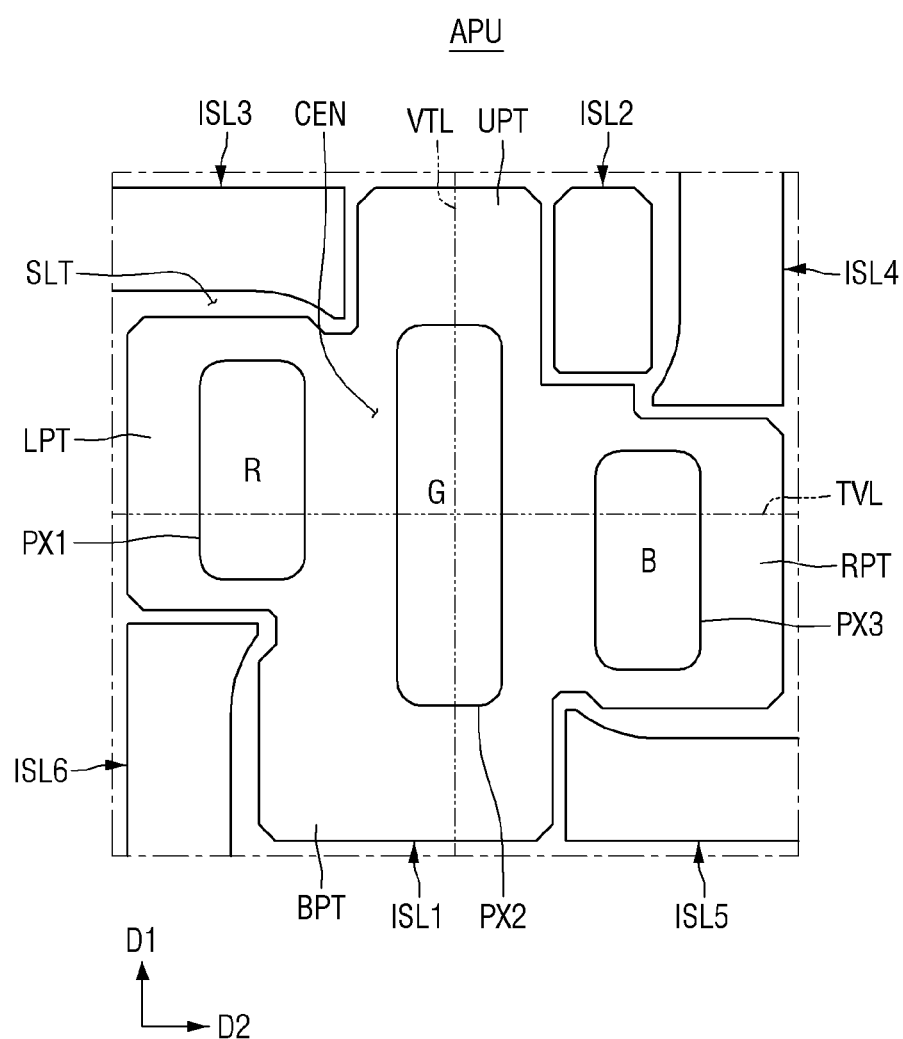
FIG. 5 is a schematic view of an array repeating unit in a pattern of the islands of FIG. 4.

FIG. 4 is a schematic view illustrating an exemplary embodiment of an arrangement of islands ISL of the substrate in a partial region of the display device. FIG. 5 is a schematic view of an array repeating unit APU in a pattern of the islands ISL of FIG. 4.

Referring to FIGS. 4 and 5, the substrate (refer to "SUB" in FIG. 7) of the display device may include a plurality of islands ISL. The islands ISL are separated from each other by cut-out portions SLT. The cut-out portions SLT pass through the substrate in the thickness direction. Materials constituting the substrate may not be in the cut-out portion SLT. The cut-out portion SLT, in which the materials constituting the substrate are not present, may be deformed more freely against the stretching than the portions that are filled with materials constituting the substrate. Accordingly, when the substrate is partially stretched, the substrate is easily stretched due to the cut-out portions SLT, thereby reducing strain applied to the substrate.

The cut-out portions SLT may be completely empty and may also be completely or partially filled with other thin films above the substrate. In one exemplary embodiment, all edges of each of the islands ISL may be surrounded by the cut-out portions SLT. In another exemplary embodiment, the adjacent islands ISL may be connected to each other by a bridge including materials constituting the substrate.

In a pattern in which the plurality of islands ISL is arranged, substantially the same basic unit (hereinafter, referred to as "array repeating unit APU") is disposed repeatedly. The array repeating units APU may have substantially the same islands ISL arrangement, and also, lines, electrodes, and the like disposed in the corresponding regions may have substantially the same pattern and the same arrangement. The array repeating unit APU may have a square shape or a rectangular shape.

The array repeating unit APU is disposed continuously along a longitudinal direction D1 (the first direction D1) and a transverse direction D2 (the second direction D2), and the adjacent array repeating units APU may have a symmetrical relationship with each other with respect to a line perpendicular to a direction in which the adjacent array repeating units APU are adjacent to each other. In an exemplary embodiment, the array repeating units APU adjacent to each other in the longitudinal direction D1 may have a line-symmetric shape with respect to a boundary crossing the space therebetween (or boundary) in the transverse direction D2, for example. In addition, the array repeating units APU adjacent to each other in the transverse direction D2 may have a line-symmetric shape with respect to a boundary crossing the space therebetween in the longitudinal direction D1.

One array repeating unit APU may include a plurality of islands ISL. Referring to the array repeating unit APU illustrated as an example in FIG. 5, the array repeating unit APU may have six islands ISL1 to ISL6.

A first island ISL1, which is the main island, has the greatest area among the islands ISL and is disposed at a center portion of the array repeating unit APU. The first island ISL1 is disposed in one array repeating unit APU and may be an independent island separated from the adjacent array repeating units APU. The first island ISL1 may have a generally "+" shape in a plan view. That is, the first island ISL1 may have a shape protruding upward (one side in the first direction D1), downward (the other side in the first direction D1), rightward (one side in the second direction D2), and leftward (the other side in the second direction D2) from a center region CEN in a plan view. Each protrusion is connected to the center region CEN.

A left protrusion LPT may be disposed such that the center of gravity thereof is biased upward from a transverse center-line TVL, and a right protrusion RPT may be disposed such that the center of gravity thereof is biased downward from the transverse center-line TVL. The left protrusion LPT and the right protrusion RPT may have a generally similar area and may have a generally point-symmetric relationship with respect to the center of the array repeating unit APU.

A lower protrusion BPT may have an area generally similar to that of the left protrusion LPT or the right protrusion RPT. The lower protrusion BPT may be disposed such that the center of gravity thereof is biased leftward from a longitudinal center-line VTL.

An upper protrusion UPT may have an area smaller than that of the lower protrusion BPT. The center of gravity of the upper protrusion UPT may lie generally on the longitudinal center-line VTL.

A second island ISL2, which is a sub island, may be disposed on one side (right side in the drawing) of the upper protrusion UPT. The second island ISL2 may have a rectangular shape that is elongated in a lengthwise direction. In an exemplary embodiment, at least one corner of the second island ISL2 may be inclined with reference to adjacent sides connected to the corner. The second island ISL2 may be an independent island separated from the adjacent array repeating units APU. The combined area of the second island ISL2 and the upper protrusion UPT may be substantially similar to that of the lower protrusion BPT.

Third to sixth islands ISL3 to ISL6 are disposed at corners of the array repeating unit APU. The third to sixth islands ISL3 to ISL6 may be connected islands disposed over adjacent array repeating units APU. The connected islands may each have a line-symmetric shape with respect to a boundary between the array repeating units APU.

The third island ISL3 is disposed at an upper-left corner of the array repeating unit APU, and has a substantially quadrangular shape that is elongated in the transverse direction D2. The third island ISL3 may be connected to the third island ISL3 of the left adjacent array repeating unit APU.

The fourth island ISL4 is disposed at an upper-right corner of the array repeating unit APU and has a substantially quadrangular shape that is elongated in the longitudinal direction D1. The fourth island ISL4 may be connected to a fourth island ISL4 of an upper adjacent array repeating unit APU.

The fifth island ISL5 is disposed at a lower-right corner of the array repeating unit APU, and has a substantially quadrangular shape that is elongated in the transverse direction D2. The fifth island ISL5 may be connected to a fifth island ISL5 of a right adjacent array repeating unit APU.

The sixth island ISL6 is disposed at a lower-left corner of the array repeating unit APU, and has a substantially quadrangular shape that is elongated in the longitudinal direction D1. The sixth island ISL6 may be connected to a sixth island ISL6 of a lower adjacent array repeating unit APU.

One or more pixels PX may be disposed in the array repeating unit APU. In an exemplary embodiment, a basic pixel group representing full color may be disposed in the array repeating unit APU, for example. As illustrated in the drawing, three pixels PX1, PX2, and PX3 of red, green, and blue, which are basic units representing full color, may be arranged in one array repeating unit APU. As another example, four pixels of red, green, blue, and white may also be arranged in one array repeating unit APU. As still another example, in one array repeating unit APU, two pixels of red, green, blue, and green may be arranged, or four pixels of red, green, blue, and green may be arranged. In addition, two or more full-color representation basic pixel groups may be arranged in one array repeating unit APU, and various other modifications may be made thereto.

Each pixel PX in the array repeating unit APU includes a pixel electrode. The pixel electrode of the first pixel PX1, the pixel electrode of the second pixel PX2, and the pixel electrode of the third pixel PX3 may be connected to different driving transistors to receive separate voltages.

Each pixel electrode may be disposed in the islands ISL of the substrate. Each pixel electrode may not be disposed in the cut-out portions SLT of the substrate. In one exemplary embodiment, the pixel electrodes of the first pixel PX1, the second pixel PX2, and the third pixel PX3 disposed in one array repeating unit APU may all be disposed in the same island ISL. In an exemplary embodiment, each pixel electrode may be disposed in the first island ISL1, which is the main island disposed in the center portion of the array repeating unit APU, for example.

In order to drive each pixel electrode of the pixel PX, a pixel circuit including a plurality of lines and plurality of transistors is desired. To this end, the plurality of lines, a plurality of electrodes, a plurality of insulating layers, a plurality of semiconductor layers, and the like may be disposed above the substrate. A portion of the lines may cross the cut-out portions SLT as well as upper portions of the islands ISL, unlike the pixel electrode.

Hereinafter, a pixel circuit of one pixel of each display device will be described.

Figure 6:
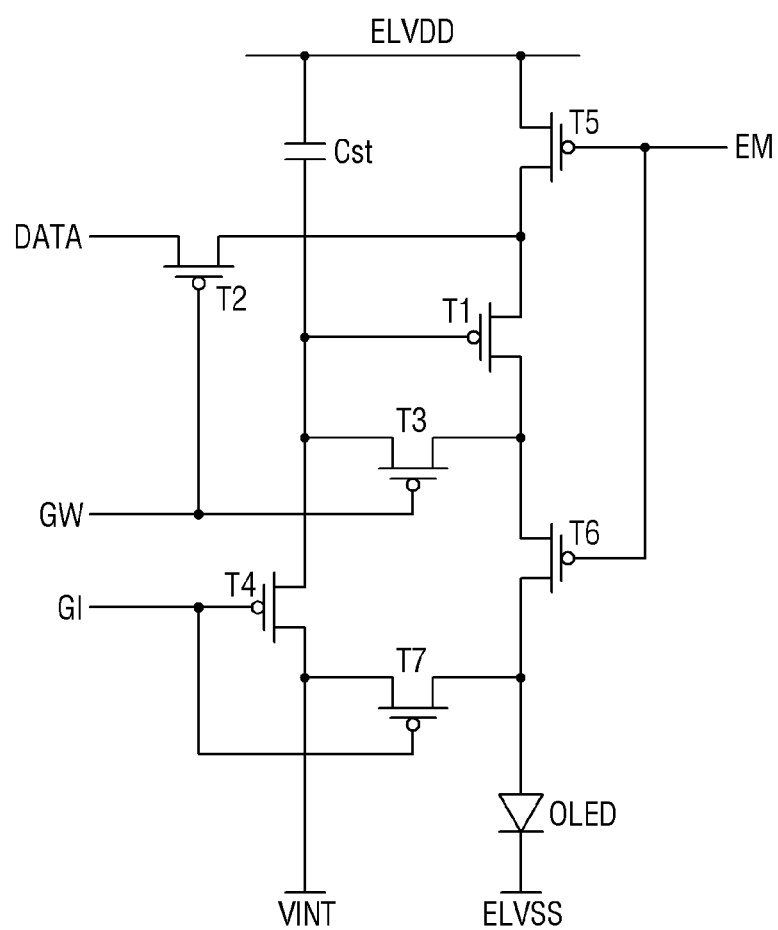
FIG. 6 is a circuit diagram of an exemplary embodiment of one pixel of the display device.

FIG. 6 is a circuit diagram of an exemplary embodiment of one pixel of the display device.

A circuit of one pixel of an organic light-emitting display device includes an organic light-emitting diode OLED, a plurality of transistors T1 to T7, and a storage capacitor Cst. A data signal DATA, a first scan signal GW, a second scan signal GI, a light emission control signal EM, a first power voltage ELVDD, a second power voltage ELVSS, and an initialization voltage VINT are applied to the circuit of one pixel. The data signal DATA may be provided through a data line DL (refer to FIG. 7), and the first scan signal GW and the second scan signal GI may be provided through a first scan line SL1 (refer to FIG. 7) and a second scan line SL2 (refer to FIG. 7), respectively, and the light emission control signal EM may be provided through a light emission signal control line EML (refer to FIG. 7). Similarly, the first power voltage ELVDD, the second power voltage ELVSS, and the initialization voltage VINT may be provided through a first power voltage line ELVDDL (refer to FIG. 7), a second power voltage line ("ELVSSL"), and an initialization voltage line VINTL (refer to FIG. 7), respectively.

The organic light-emitting diode OLED includes an anode including a pixel electrode PXL (refer to FIG. 7), a cathode including a common electrode CME (refer to FIG. 7), and an organic layer OML (refer to FIG. 7) interposed therebetween.

Figure 7:
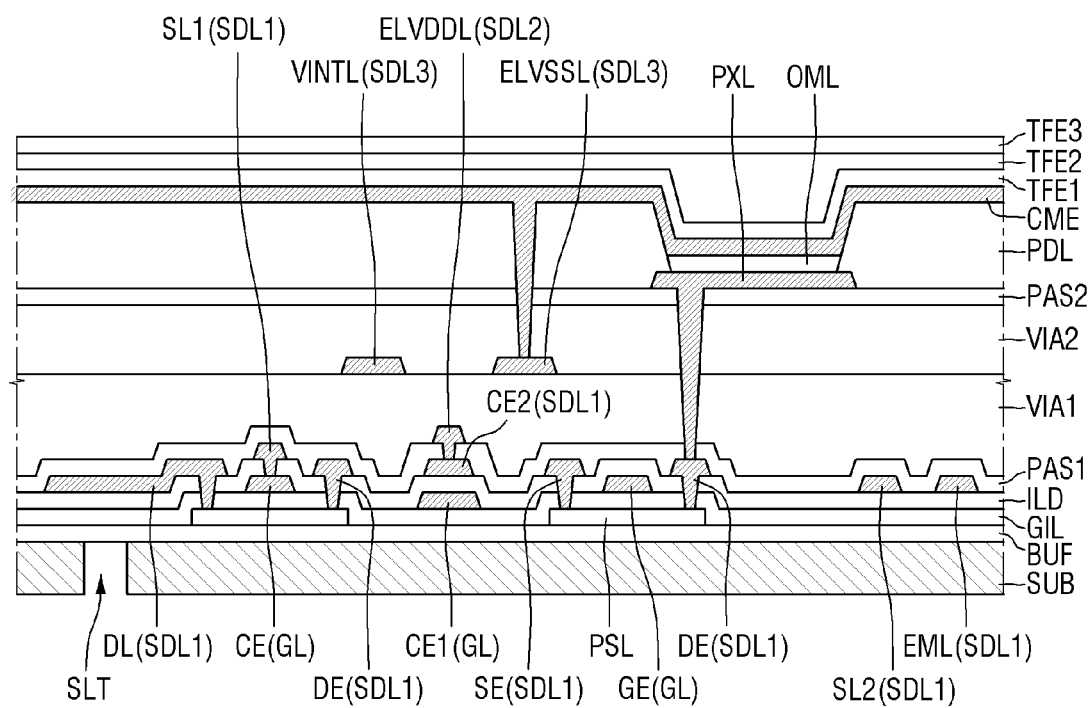
FIG. 7 is a cross-sectional view of an exemplary embodiment of the display device.

The storage capacitor Cst includes a first electrode CE1 (refer to FIG. 7) and a second electrode CE2 (refer to FIG. 7).

The plurality of transistors may include first to seventh transistors T1 to T7. Each of the transistors includes a gate electrode, a first source/drain electrode, and a second source/drain electrode. One of the first source/drain electrode and second source/drain electrode becomes a source electrode, and the other one thereof becomes a drain electrode. Hereinafter, for the convenience of description, the first source/drain electrode will be referred to as a first electrode, and the second source/drain electrode will be referred to as a second electrode.

Each of the transistors T1 to T7 may be a thin-film transistor ("TFT"). Each of the transistors T1 to T7 may be one of a p-type metal-oxide-semiconductor ("PMOS") transistor and an n-type metal-oxide-semiconductor ("NMOS") transistor. Although the seven transistors may all be the same type of transistors, some transistors may be PMOS transistors and the remaining transistors may be NMOS transistors. In the drawing, the case in which the seven transistors are all PMOS transistors is illustrated.

The first transistor T1 is a driving transistor, the gate electrode of the first transistor T1 is connected to the first electrode of the storage capacitor Cst, the first electrode of the first transistor T1 is connected to a terminal of the first power voltage ELVDD via the fifth transistor T5, and the second electrode of the first transistor T1 is connected to the anode of the organic light-emitting diode OLED via the sixth transistor T6. The first transistor T1 receives the data signal DATA through the data line according to a switching operation of the second transistor T2 and supplies a driving current Id to the organic light-emitting diode OLED.

The second transistor T2 is a data transfer transistor, the gate electrode of the second transistor T2 is connected to a terminal of the first scan signal GW, the first electrode of the second transistor T2 is connected to a terminal of the data signal DATA, and the second electrode of the second transistor T2 is connected to the terminal of the first power voltage ELVDD via the fifth transistor T5 while being connected to the first electrode of the first transistor T1. The second transistor T2 is turned on in response to the first scan signal GW to perform a switching operation of transmitting the data signal DATA to the first electrode of the first transistor T1.

The third transistor T3 is a compensation transistor, the gate electrode of the third transistor T3 is connected to the terminal of the first scan signal GW, the first electrode of the third transistor T3 is connected to the anode of the organic light-emitting diode OLED via the sixth transistor T6 while being connected to the second electrode of the first transistor T1, and the second electrode of the third transistor T3 is connected to the first electrode of the storage capacitor Cst, the first electrode of the fourth transistor T4, and the gate electrode of the first transistor T1. The third transistor T3 is turned on in response to the first scan signal GW to connect the gate electrode and the second electrode of the first transistor T1 so that the first transistor T1 is diode-connected. Accordingly, a voltage difference corresponding to a threshold voltage of the first transistor T1 may occur between the first electrode and the gate electrode of the first transistor T1, and a threshold voltage variation of the first transistor T1 may be compensated for by supplying the data signal DATA, whose threshold voltage is compensated, to the gate electrode of the first transistor T1.

The fourth transistor T4 is a first initialization transistor, the gate electrode of the fourth transistor T4 is connected to a terminal of the second scan signal GI, the second electrode of the fourth transistor T4 is connected to a terminal of the initialization voltage VINT, and the first electrode of the fourth transistor T4 is connected to the first electrode of the storage capacitor Cst, the second electrode of the third transistor T3, and the gate electrode of the first transistor T1. The fourth transistor T4 is turned on in response to the second scan signal GI to transfer the initialization voltage VINT to the gate electrode of the first transistor T1, thereby performing an operation of initializing the voltage of the gate electrode of the first transistor T1.

The fifth transistor T5 is a first light emission control transistor, the gate electrode of the fifth transistor T5 is connected to a terminal of the light emission control signal EM, the first electrode of the fifth transistor T5 is connected to the terminal of the first power voltage ELVDD, and the second electrode of the fifth transistor T5 is connected to the first electrode of the first transistor T1 and the second electrode of the second transistor T2.

The sixth transistor T6 is a second light emission control transistor, the gate electrode of the sixth transistor T6 is connected to the terminal of the light emission control signal EM, the first electrode of the sixth transistor T6 is connected to the second electrode of the first transistor T1 and the first electrode of the third transistor T3, and the second electrode of the sixth transistor T6 is connected to the anode of the organic light-emitting diode OLED.

The fifth transistor T5 and the sixth transistor T6 are turned on simultaneously in response to the light emission control signal EM and thus the driving current Id flows through the organic light-emitting diode OLED.

The seventh transistor T7 is a second initialization transistor, the gate electrode of the seventh transistor T7 is connected to the terminal of the second scan signal GI, the first electrode of the seventh transistor T7 is connected to the anode of the organic light-emitting diode OLED, and the second electrode of the seventh transistor T7 is connected to the terminal of the initialization voltage VINT. The seventh transistor T7 is turned on in response to the light emission control signal EM to initialize the anode of the organic light-emitting diode OLED.

The second electrode of the storage capacitor Cst is connected to the terminal of the first power voltage ELVDD. The first electrode of the storage capacitor Cst is connected to the gate electrode of the first transistor T1, the second electrode of the third transistor T3, and the first electrode of the fourth transistor T4. The cathode of the organic light-emitting diode OLED is connected to a terminal of the second power voltage ELVSS. The organic light-emitting diode OLED receives the driving current Id from the first transistor T1 and emits light to display an image.

The illustrated pixel circuit structure may be variously modified. In an exemplary embodiment, a 2T1C structure including two transistors of first and second transistors and one capacitor, or 3T1C, 3T2C, 6T1C, or the like may be applied in various forms known in the art, for example.

FIG. 7 is a cross-sectional view of an exemplary embodiment of the display device in the exemplary embodiment. FIG. 7 illustrates a cross section of the first transistor and the second transistor of the plurality of transistors in FIG. 6. For the convenience of description, FIG. 7 illustrates that a second source/drain electrode DE of the first transistor is directly connected to the pixel electrode PXL without the sixth transistor. Further, the cut-out portions SLT of the substrate SUB are not illustrated in FIG. 7.

Referring to FIG. 7, the display device includes the substrate SUB. The substrate SUB may include a flexible polymer. Since the description thereof is already given above, a duplicated description will be omitted.

A buffer layer BUF is disposed on the substrate SUB. The buffer layer BUF may prevent the diffusion of impurity ions and the penetration of moisture or external air, and perform a surface planarization function.

A semiconductor layer PSL is disposed on the buffer layer BUF. The semiconductor layer PSL forms channels of the TFT of the pixel PX. The semiconductor layer PSL may include polycrystalline silicon. However, the invention is not limited thereto, and the semiconductor layer PSL may also include monocrystalline silicon, low-temperature polycrystalline silicon, amorphous silicon, or an oxide semiconductor. In an exemplary embodiment, the oxide semiconductor may include at least one of a binary compound (ABx), a ternary compound (ABxCy), or a quaternary compound (ABxCyDz), which includes indium, zinc, gallium, tin, titanium, aluminum, hafnium (Hf), zirconium (Zr), magnesium (Mg), and the like.

A gate insulating film GIL is disposed on the semiconductor layer PSL. A gate conductive layer GL is disposed on the gate insulating film GIL. The gate conductive layer GL may include the first electrode CE1 of the storage capacitor and the gate electrode GE of the TFT of the pixel PX. The gate conductive layer GL may include one or more metals including at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The gate conductive layer GL may be provided as a single-layer film or a multilayer film.

An interlayer insulating film ILD is disposed on the gate conductive layer GL. A source/drain conductive layer SDL is disposed above the interlayer insulating film ILD. The source/drain conductive layer SDL may include a plurality of conductive layers separated from each other by an insulating film. In an exemplary embodiment, the source/drain conductive layer SDL may include a first source/drain conductive layer SDL1, a second source/drain conductive layer SDL2, and a third source/drain conductive layer SDL3, for example. A first passivation layer PAS1 as an insulating film may be disposed between the first source/drain conductive layer SDL1 and the second source/drain conductive layer SDL2, and a first via layer VIA1 as an insulating film may be disposed between the second source/drain conductive layer SDL2 and the third source/drain conductive layer SDL3. A second via layer VIA2 may be disposed on the third source/drain conductive layer SDL3, and a second passivation layer PAS2 may be disposed on the second via layer VIA2.

The source/drain conductive layer SDL may include one or more metals including at least one of Al, Mo, Pt, Pd, Ag, Mg, Au, Ni, Nd, Ir, Cr, Ca, Ti, Ta, W, and Cu. The source/drain conductive layer SDL may be provided as a single-layer film or a multilayer film. In an exemplary embodiment, the source/drain conductive layer SDL may be provided in a stacked structure of Ti/Al/Ti, Mo/Al/Mo, Mo/AlGe/Mo, Ti/Cu, and the like, for example.

The various lines and electrodes constituting the pixel circuit may include the source/drain conductive layer SDL.

In an exemplary embodiment, the first source/drain conductive layer SDL1 may include the data line DL, and a first source/drain electrode SE and the second source/drain electrode DE of the TFT, for example. In addition, portions of the first scan line SL1, the second scan line SL2, the light emission signal control line EML, and the like may also include the first source/drain conductive layer SDL1. The first scan line SL1, the second scan line SL2, and the light emission signal control line EML may be electrically connected to the gate conductive layer GL therebelow through contact holes passing through the interlayer insulating film ILD. Furthermore, the second electrode CE2 of the storage capacitor may also include the first source/drain conductive layer SDL1. The second source/drain conductive layer SDL2 may include the first power voltage line ELVDDL, and the third source/drain conductive layer SDL3 may include the second power voltage line ELVSSL and the initialization voltage line VINTL. In addition, the source/drain conductive layer SDL may further include test lines TSL. A detailed description of the test lines TSL will be given below.

The number of the gate conductive layers GL and the source/drain conductive layers SDL, or the lines included in each source/drain conductive layer SDL may be variously modified according to a plan or the like. In an exemplary embodiment, a separate gate conductive layer forming the second electrode CE2 of the storage capacitor may be further disposed between the gate conductive layer GL and the first source/drain conductive layer SDL1, for example. In some cases, the gate conductive layer GL may be omitted, and the gate electrode, the scan line, the first electrode CE1 of the storage capacitor, and the like may be provided by the source/drain conductive layer SDL. An exemplary layout of the source/drain conductive layer SDL will be described below.

The second passivation layer PAS2 is disposed on the third source/drain conductive layer SDL3. The pixel electrode PXL is disposed on the second passivation layer PAS2. The pixel electrode PXL may be electrically connected to the second source/drain electrode DE of the TFT (first transistor). In an exemplary embodiment, the pixel electrode PXL may have a stacked film structure in which a material layer having a high work function such as indium tin oxide ("ITO"), indium zinc oxide ("IZO"), zinc oxide (ZnO), or indium oxide (In2O3) and a reflective material layer, such as Ag, Mg, Al, Pt, lead (Pb), Au, Ni, Nd, Ir, Cr, Li, Ca, or a combination thereof are stacked. A layer having a high work function may be disposed above the reflective material layer and disposed close to the organic layer. In an exemplary embodiment, the pixel electrode PXL may have a multilayer structure of ITO/Mg, ITO/MgF, ITO/Ag, and ITO/Ag/ITO, but the invention is not limited thereto.

A pixel definition film PDL may be disposed on the pixel electrode PXL. An opening that exposes the pixel electrode PXL may be defined in the pixel definition film PDL.

The organic layer OML is disposed in the opening of the pixel definition film PDL. The organic layer OML may include an organic light-emitting layer, a hole injection/transport layer, and an electron injection/transport layer.

The common electrode CME is disposed on the organic layer OML and the pixel definition film PDL. The common electrode CME may be disposed on the entire surface of each pixel PX. The common electrode CME may include a material layer having a low work function, which includes Li, Ca, LiF/Ca, LiF/Al, Al, Mg, Ag, Pt, Pd, Ni, Au, Nd, Ir, Cr, BaF, Ba, and compounds or combinations thereof (for example, a combination of Ag and Mg). The common electrode CME may further include a transparent metal oxide layer disposed on the material layer having the low work function. The common electrode CME may be connected to the second power voltage line ELVSSL including the third source/drain conductive layer SDL3 through contact holes passing through the pixel definition film PDL, the second passivation layer PAS2, and the second via layer VIA2.

Thin-film encapsulation layers TFE may be disposed on the common electrode CME. The thin-film encapsulation layers TFE may include a first inorganic encapsulation layer TFE1, an organic encapsulation layer TFE2, and a second inorganic encapsulation layer TFE3.

In an exemplary embodiment, each of the buffer layer BUF, the gate insulating film GIL, the interlayer insulating film ILD, the first passivation layer PAS1, and the second passivation layer PAS2, that are described above, may include an inorganic insulating material such as silicon oxide, silicon nitride, silicon oxynitride, hafnium oxide, aluminum oxide, titanium oxide, tantalum oxide, or zinc oxide. In an exemplary embodiment, each of the first via layer VIA1, the second via layer VIA2, and the pixel definition film PDL may include an organic insulating material such as a polyacrylate resin, an epoxy resin, a phenolic resin, a polyamide resin, a polyimide resin, an unsaturated polyester resin, a polyphenylene ether resin, a polyphenylene sulfide resin, or benzocyclobutene ("BCB"). However, it should be understood that the materials constituting the insulating film are not limited to those illustrated above, and various materials known in the art may be applied to the constituent materials of each insulating film.

Hereinafter, an exemplary layout of the source/drain conductive layer SDL and the test lines TSL for each conductive layer will be described.

Figure 8:
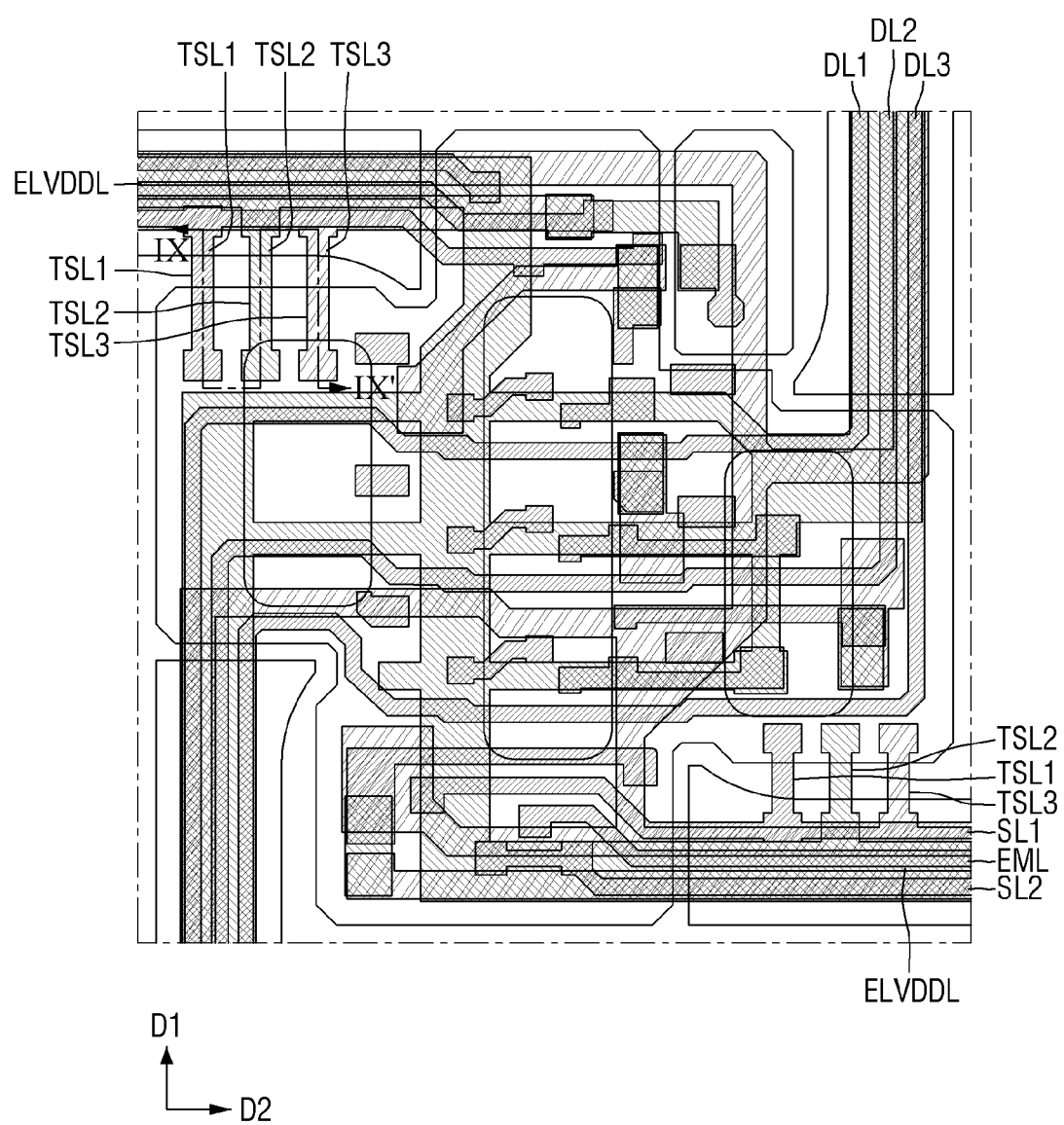
FIG. 8 is a plan view of an exemplary embodiment of source/drain conductive layers in the array repeating unit.
Figure 9:
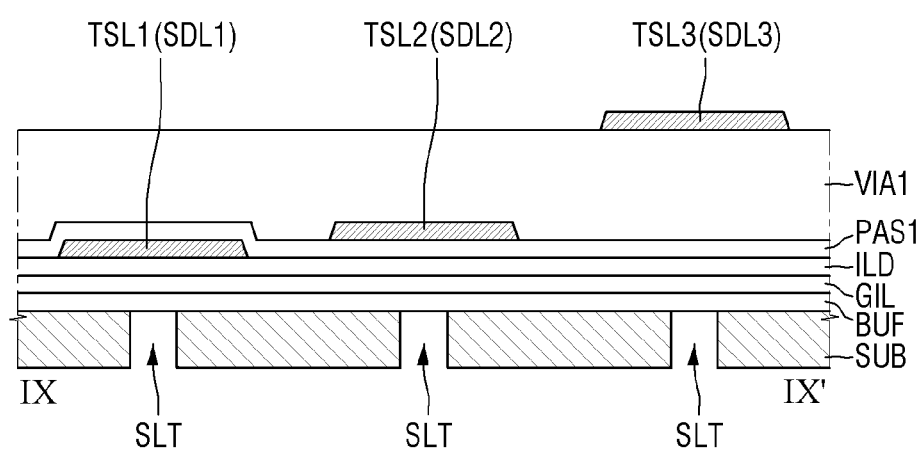
FIG. 9 is a cross-sectional view taken along line IX-IX' of FIG. 8.
Figure 10:
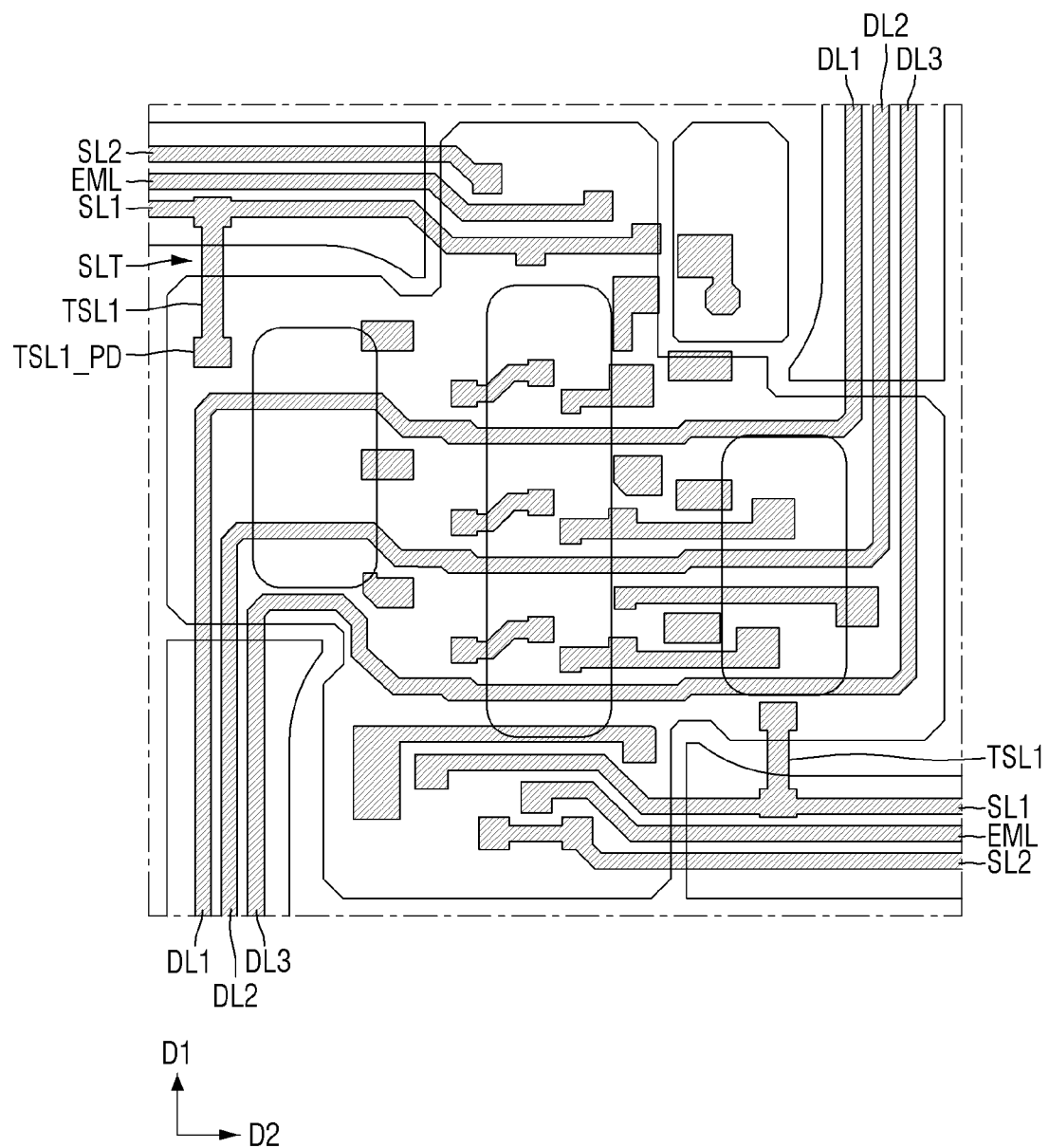
FIG. 10 is a plan view of a first source/drain conductive layer of FIG. 8.
Figure 11:
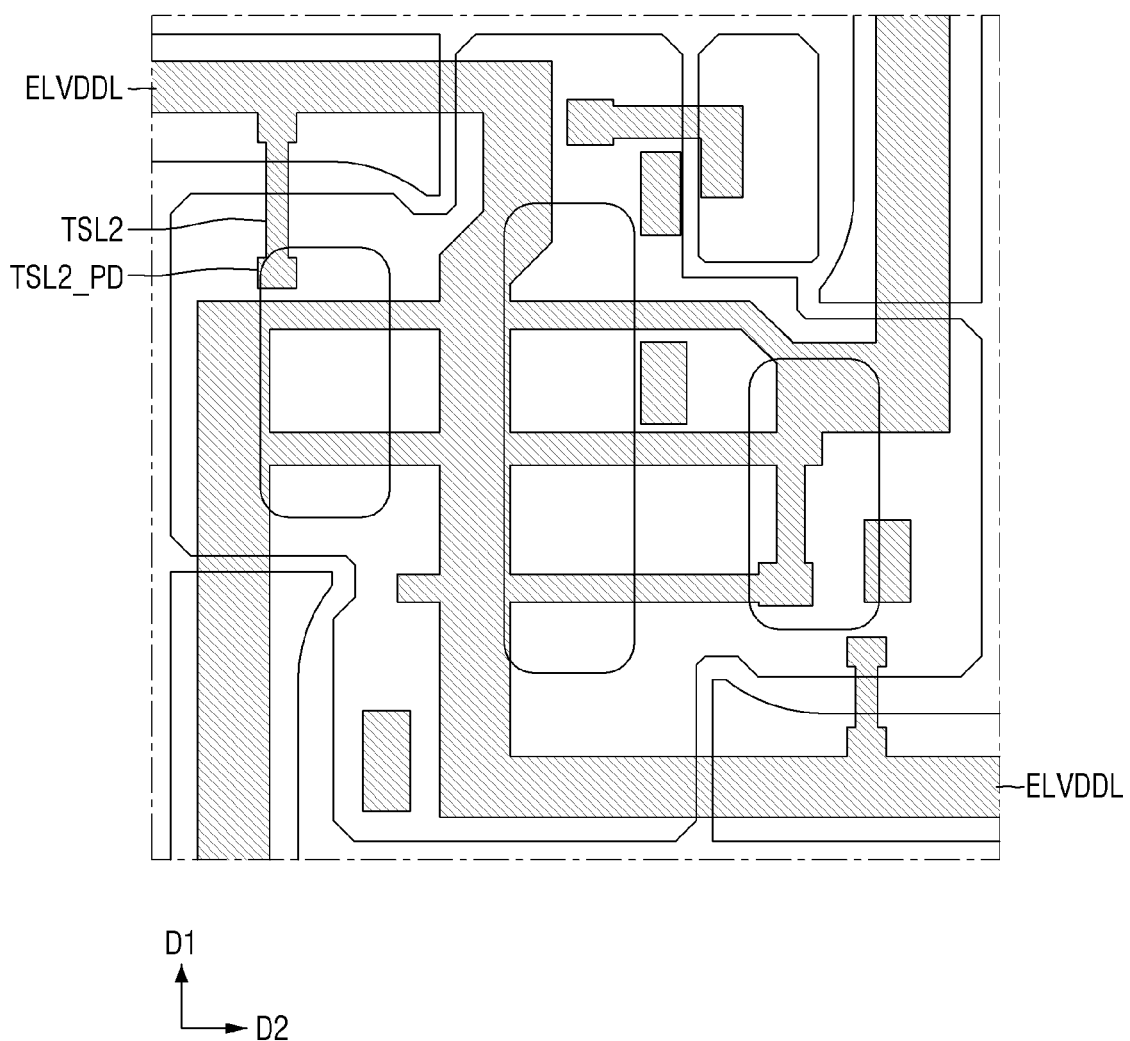
FIG. 11 is a plan view of a second source/drain conductive layer of FIG. 8.
Figure 12:
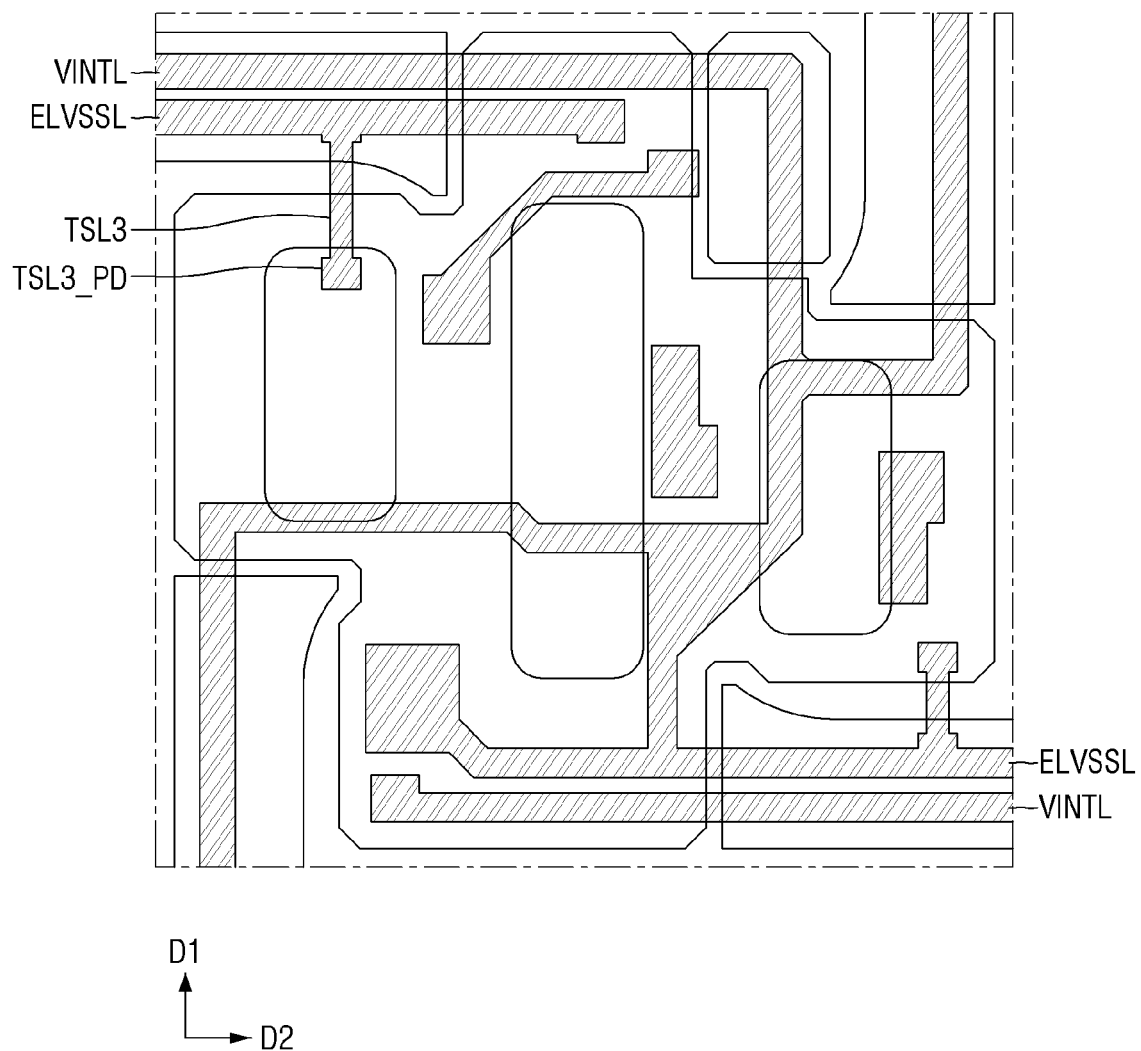
FIG. 12 is a plan view of a third source/drain conductive layer of FIG. 8.

FIG. 8 is a plan view of the source/drain conductive layers in the array repeating unit in the exemplary embodiment. FIG. 9 is a cross-sectional view taken along line IX-IX' of FIG. 8. FIG. 10 is a plan view of the first source/drain conductive layer of FIG. 8. FIG. 11 is a plan view of the second source/drain conductive layer of FIG. 8. FIG. 12 is a plan view of the third source/drain conductive layer of FIG. 8.

Referring to FIGS. 8 to 12, the first source/drain conductive layer SDL1 may include a first data line DL1 through which the data signal is transmitted to the first pixel PX1, a second data line DL2 through which the data signal is transmitted to the second pixel PX2, a third data line DL3 through which the data signal is transmitted to the third pixel PX3. The data lines DL extend upward from a lower boundary of the sixth island ISL6 (refer to FIG. 5) and pass through the cut-out portion SLT to reach the left protrusion LPT (refer to FIG. 5) of the first island ISL1 (refer to FIG. 5) and then are bent in a rightward direction to extend to the right protrusion RPT (refer to FIG. 5) of the first island ISL1. At the right protrusion RPT of the first island ISL1, the data lines DL are bent and extend upwards again to extend to an upper boundary of the fourth island ISL4 (refer to FIG. 5) by passing through the cut-out portion SLT. Although not illustrated in the drawings, the data lines DL disposed at the lower boundary of the sixth island ISL6 may extend to a sixth island ISL6 of another array repeating unit APU disposed therebelow, and the data lines DL disposed at the upper boundary of the fourth island ISL4 may extend to a fourth island ISL4 of another array repeating unit APU disposed thereabove.

The first source/drain conductive layer SDL1 may further include the first scan line SL1, the second scan line SL2, and the light emission signal control line EML respectively through which the first scan signal, the second scan signal, and the light emission control signal are provided to the first pixel PX1, the second pixel PX2, and the third pixel PX3. Portions of the first scan line SL1, the second scan line SL2, and the light emission signal control line EML extend rightward from a left boundary of the third island ISL3 and extend to the upper protrusion UPT of the first island ISL1 beyond the cut-out portion SLT and terminate. Symmetrically, other portions of the first scan line SL1, the second scan line SL2, and the light emission signal control line EML extend leftward from a right boundary of the fifth island ISL5 (refer to FIG. 5) and extend to the lower protrusion BPT of the first island ISL1 beyond the cut-out portion SLT and terminate. In addition, fragments of the first source/drain conductive layer SDL1 may be disposed in the first island ISL1 and the second island ISL2, and the signal lines may be connected to the fragments through another conductive layer.

The second source/drain conductive layer SDL2 includes the first power voltage line ELVDDL. A portion of the first power voltage line ELVDDL extending from the sixth island ISL6 to the fourth island ISL4 through the first island ISL1 and another portion of the first power voltage line ELVDDL extending from the third island ISL3 to the fifth island ISL5 through the first island ISL1 cross each other at the first island ISL1. Some fragments of the second source/drain conductive layer SDL2 extend from the upper protrusion UPT of the first island ISL1 to the second island ISL2. In addition, the second source/drain conductive layer SDL2 may further include a plurality of fragments disposed in the first island ISL1.

The third source/drain conductive layer SDL3 includes the initialization voltage line VINTL and the second power voltage line ELVSSL. A portion of the initialization voltage line VINTL extends rightward from the left boundary of the third island ISL3 and extends to the upper protrusion UPT of the first island ISL1 beyond the cut-out portion SLT and terminates. Symmetrically, another portion of the initialization voltage line VINTL extends leftward from the right boundary of the fifth island ISL5 and extends to the lower protrusion BPT of the first island ISL1 beyond the cut-out portion SLT and terminates. The second power voltage line ELVSSL extends from the sixth island ISL6 to the right protrusion RPT of the first island ISL1 and branches at the right protrusion RPT of the first island ISL1, and a portion of the branched second power voltage line ELVSSL extends to the fourth island ISL4 and another portion of the branched second power voltage line ELVSSL extends to the second island ISL2, the upper protrusion UPT of the first island ISL1, and the third island ISL3. In addition, the third source/drain conductive layer SDL3 may further include a plurality of fragments disposed in the first island ISL1.

As described above, the lines including the source/drain conductive layer SDL may extend to cross the plurality of islands ISL of the substrate SUB. A portion of the lines are also disposed on the cut-out portion SLT of the substrate SUB. However, as the width of the cut-out portion SLT is stretched relatively more in the process in which the substrate SUB is stretched, the lines placed on the cut-out portion SLT may be subjected to strong stress. In some cases, the lines on the cut-out portion SLT may be disconnected during the stretching process, which may lead to display defects. However, even when the display defects are confirmed, it is difficult to confirm whether it is due to the disconnection of the lines on the cut-out portion SLT, or for other reasons because there are various causes of the display defects. Each source/drain conductive layer SDL may include the test lines TSL to identify the exact causes and/or the defect causing factors of the display defects at each process operation.

The test line TSL includes the corresponding source/drain conductive layer SDL. The test lines TSL may include, for example, at least one of a first test line TSL1 including the first source/drain conductive layer SDL1, a second test line TSL2 including the second source/drain conductive layer SDL2, and a third test line TSL3 including the third source/drain conductive layer SDL3. Although the test lines TSL are illustrated in the drawing as including all of the first to third test lines TSL1 to TSL3, some of the first to third test lines TSL1 to TSL3 may be omitted.

The first test line TSL1, the second test line TSL2, and the third test line TSL3 may not overlap each other. However, the invention is not limited thereto, and some or all may be disposed overlapping each other.

The test lines TSL cross the cut-out portions SLT. In one exemplary embodiment, one end portions and the other end portions of the test lines TSL may be disposed in different islands ISL. Specifically, as illustrated in the drawings, one end portions of some test lines TSL may be disposed in the left protrusion LPT of the first island ISL1, and the other end portions thereof may be disposed in the third island ISL3 adjacent to the left protrusion LPT. One end portions of some other test lines TSL may be disposed in the right protrusion RPT of the first island ISL1, and the other end portions thereof may be disposed in the fifth island ISL5 adjacent to the right protrusion RPT.

In another exemplary embodiment, both end portions of the test lines TSL may be disposed in the same island ISL. In this case, the test lines TSL may cross the cut-out portion SLT two or more times while changing the extending direction thereof a plurality of times.

The both end portions of the test lines TSL may include pad regions TSL1_PD, TSL2_PD, and TSL3_PD that are more expanded in width than the extending portions. The expanded pad regions TSL1_PD, TSL2_PD, and TSL3_PD may be used for probes to apply the signal directly.

At least one of the both end portions of the test lines TSL may be separated from other signal lines. In an exemplary embodiment, one end portions of the test lines TSL disposed in the first island ISL1 having sufficient space may be disposed to be spaced apart from other signal lines in the periphery thereof, for example. The other end portions of the test lines TSL disposed in the third island ISL3 and the fifth island ISL5, in which the space is somewhat insufficient, may be connected to the adjacent signal lines. In an exemplary embodiment, the other end portion of the first test line TSL1 may be connected to the first scan line SL1, the other end portion of the second test line TSL2 may be connected to the first power voltage line ELVDDL, and the other end portion of the third test line TSL3 may be connected to the second power voltage line ELVSSL or the initialization voltage line VINTL, for example. As in the case of the first test line TSL1, when a width of a line connected to the extended pad region TSL1_PD of the first test line TSL1 is less than a width of the extended pad region TSL1_PD, a portion of the extended pad region TSL1_PD may protrude from the line connected to the pad region TSL1_PD. As in the case of the second test line TSL2, when a width of a line connected to the extended pad region TSL2_PD is sufficient, the extended pad region TSL2_PD may be disposed in the line connected to the extended pad region TSL2_PD, and thus the shape thereof may not be observed.

The test lines TSL may be used to confirm the disconnection of the corresponding lines at the intermediate operation of the process. In an exemplary embodiment, the first source/drain conductive layer SDL1 is provided, for example. Thereafter, the probes are directly brought into contact with the extended pad regions TSL1_PD of one end portion and the other end portion of the first test line TSL1, respectively, to measure the resistance of the first test line TSL1. Before measuring the resistance of the first test line TSL1, a plurality of stretching tests may be performed. Through the resistance measurement, it may be confirmed whether the first test line TSL1 that crosses the cut-out portion SLT is disconnected. When the first test line TSL1 is disconnected, it is determined that the disconnection is made to the first source/drain conductive layer SDL1, and the corresponding intermediate structure may be treated as a defective structure. Since the first test line TSL1 is disposed in the array repeating unit APU in the display area DPA, it is possible to directly test whether the disconnection occurs in the corresponding array repeating unit APU in which the actual pixels PX are disposed, not outside the display area DPA so that a position where a defect occurs may be specifically identified. In the same manner, after the second source/drain conductive layer SDL2 is provided, it may be determined whether the second test line TSL2 is disconnected by measuring the resistance of the second test line TSL2. In addition, after the third source/drain conductive layer SDL3 is provided, it may be determined whether the third test line TSL3 is disconnected by measuring the resistance of the third test line TSL3.

The intermediate structures that have been tested by bringing the probes into contact with the test lines TSL may be discarded after only being used to determine whether there is a defect. When it is determined that the defect exists, it may be assumed that there is a problem in the position and the width of the cut-out portion SLT of the substrate SUB, and the formation process of the corresponding source/drain conductive layer SDL, and process conditions and the like may be examined again. When it is determined that no defect exists, the existing process conditions may be confirmed as good conditions.

The test using the test lines TSL may be performed by sampling some of the intermediate structures for which the same process is completed. To this end, the test lines TSL may be disposed only on the intermediate structures to be sampled among the various intermediate structures, but such a method may be inefficient due to the characteristics of a mask process. Accordingly, it may be more effective in process efficiency to form the test lines TSL in all products to be manufactured and then evaluate whether the test lines TSL are disconnected for some of all products. When it is determined that there is a defect as a result of the test, intermediate structures manufactured in the same process may be discarded or repaired, and when it is determined that there are no defects, the intermediate structures manufactured in the same process may be completed into a final product through the following processes. Although the display device completed in such a method may include the test lines TSL, the test may not be made for the intermediate structures of the corresponding display device.

Figure 13:
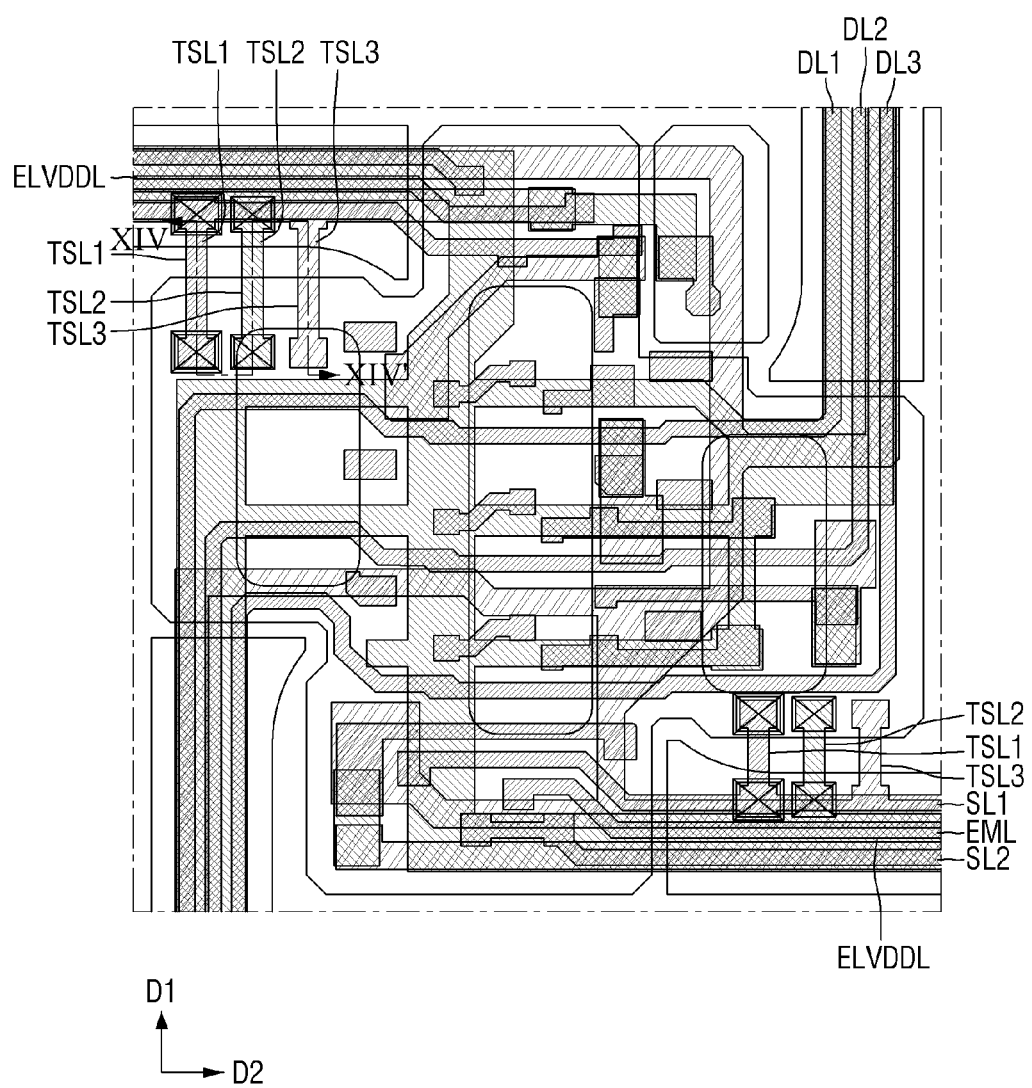
FIG. 13 is a plan view of an exemplary embodiment of source/drain conductive layers in an array repeating unit.
Figure 14:
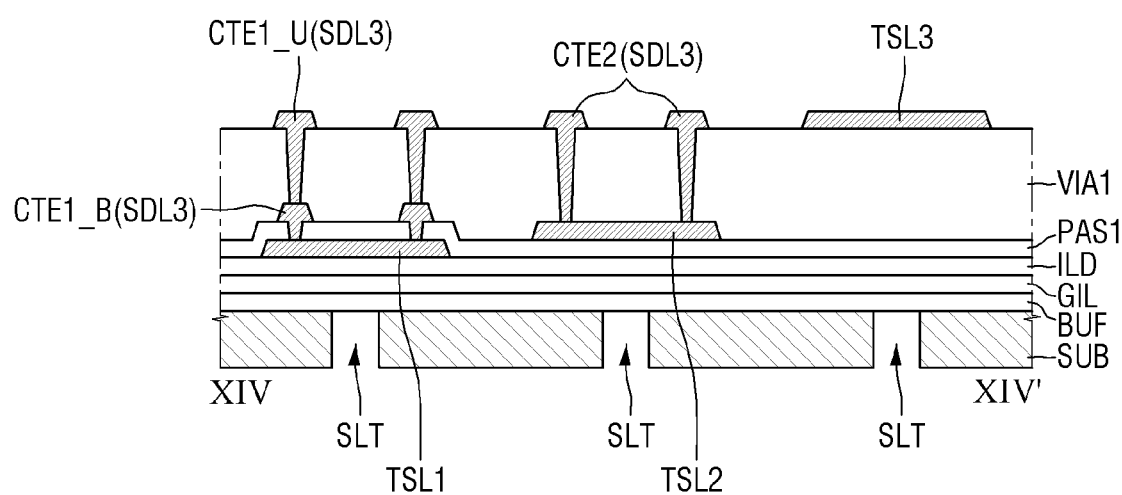
FIG. 14 is a cross-sectional view taken along line XIV-XIV' of FIG. 13.

FIG. 13 is a plan view of source/drain conductive layers in an array repeating unit according to another exemplary embodiment. FIG. 14 is a cross-sectional view taken along line XIV-XIV' of FIG. 13.

Referring to FIGS. 13 and 14, a display device according to the illustrated exemplary embodiment is different from the exemplary embodiment described with reference to FIGS. 8 and 9 in that each of test lines TSL includes contact electrodes.

Specifically, first to third test lines TSL1 to TSL3 are disposed on different layers. Since the first test line TSL1 is exposed to the outside when a first source/drain conductive layer SDL1 is provided, it is possible to measure the resistance by bringing probes into contact, but at this operation, the second test line TSL2 is not provided and thus the resistance of the second test line TSL2 may not be measured all at once. Subsequent processes must be performed to measure the resistance of the second test line TSL2, and in this case, since a second passivation layer PAS2 covers the first source/drain conductive layer SDL1, the first test line TSL1 is not exposed to the outside and thus it is difficult to perform the test by contacting the probes. In order to make the test bringing the probes into contact possible on the first test line TSL1 even after the second test line TSL2 is provided, a second source/drain conductive layer SDL2 may include a first lower contact electrode CTE1_B in contact with a pad region TSL1_PD, which is extended, of the first test line TSL1 by passing through a second passivation layer PAS2. When the contact electrodes of the second test line TSL2 and the first test line TSL1 include the second source/drain conductive layer SDL2, the second test line TSL2 and the first test line TSL1 may be tested at once. That is, the resistance of each test line TSL may be measured by sequentially or simultaneously bringing the probes into contact with the first lower contact electrode CTE1_B of the first test line TSL1 and the second test line TSL2.

The same method may also be applied to the third test line TSL3. That is, a first upper contact electrode CTE1_U, which is connected to the first lower contact electrode CTE1_B of the first test line TSL1 by passing through the first via layer VIA1, and a second contact electrode CTE2 connected to the second test line TSL2 may include a third source/drain conductive layer SDL3. As a result, the first upper contact electrode CTE1_U of the first test line TSL1, the second contact electrode CTE2 of the second test line TSL2, and the third test line TSL3 are exposed to the outside, and the probes are sequentially or simultaneously brought into contact therewith to measure the resistance of each test line TSL.

The configuration of the contact electrodes illustrated in FIGS. 13 and 14 is merely an example and various modifications are possible. In an exemplary embodiment, the first contact electrode CTE1 for exposing the first test line TSL1 to the outside may include the third source/drain conductive layer SDL3 without the second source/drain conductive layer SDL2, for example. Further, a contact electrode passing through to another insulating layer disposed above the third source/drain conductive layer SDL3 may be provided using a material of the pixel electrode PXL.

Figure 15:
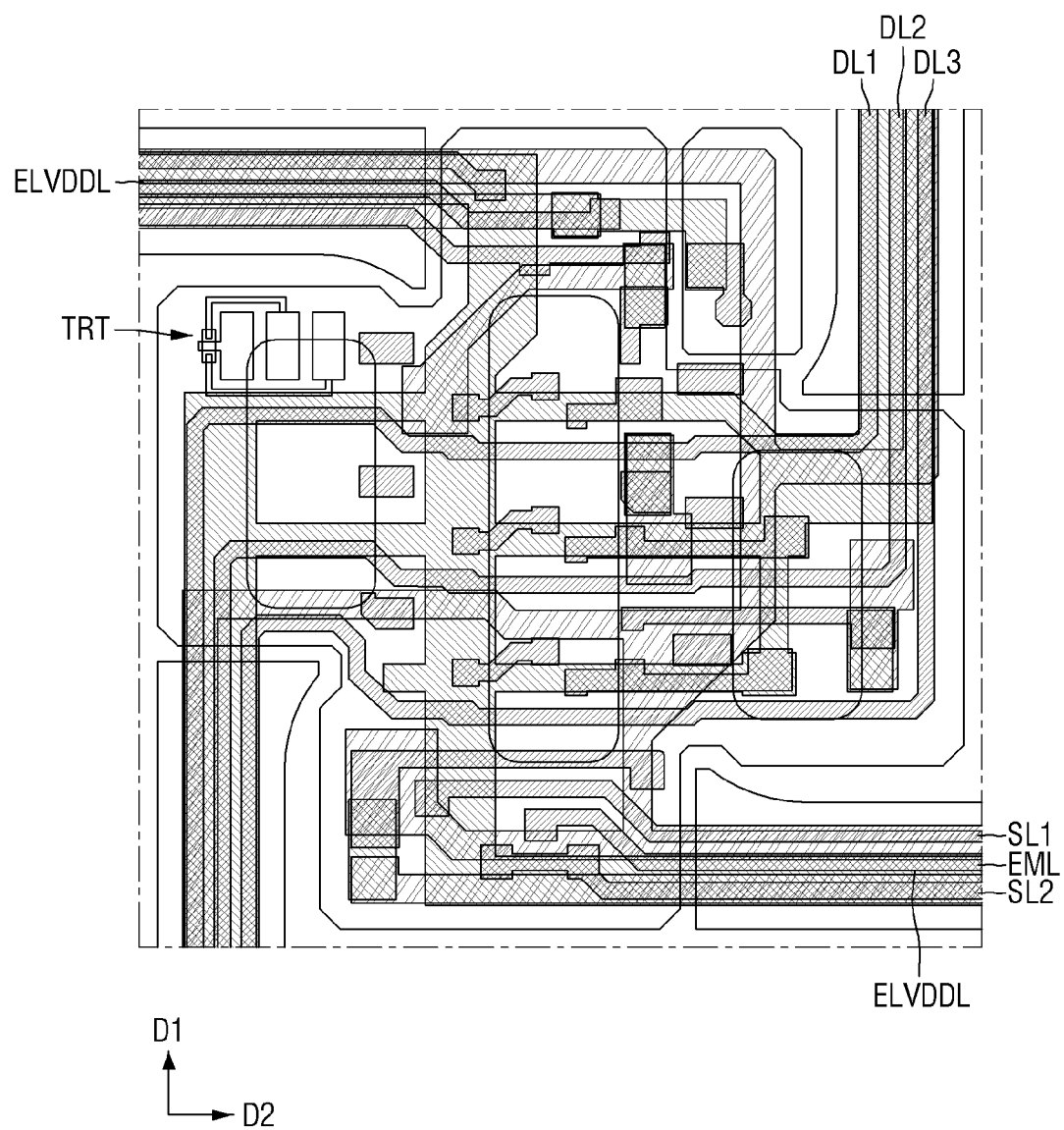
FIG. 15 is a plan view of an exemplary embodiment of source/drain conductive layers in an array repeating unit.

FIG. 15 is a plan view of an exemplary embodiment of source/drain conductive layers in an array repeating unit according to another exemplary embodiment. The exemplary embodiment in FIG. 15 illustrates that the display device may include a test transistor capable of analyzing the characteristic values of transistors in pixel units.

The display device includes a plurality of pixels PX, and each of the pixels PX includes a plurality of transistors (pixel circuit transistors) as described with reference to FIG. 6. The transistors of each of the pixels PX may be simultaneously provided through the same process. Although the plurality of transistors is provided through the same process, each of the transistors may have different characteristic values depending on the positions thereof. In an exemplary embodiment, the width or length of a channel may be different for each position due to misalignment or the like, or thickness differences may occur in films due to the influence of the surrounding structure, for example. In addition, temperature differences may occur for each position in process operations, and thus the components of deposited materials may be partially different from each other. Such minute differences in process conditions for each position may cause the provided transistors to have different threshold voltages, off-currents, voltage-current curves, and the like. As a substrate SUB or a mother substrate SUB becomes larger, the characteristic values of the transistors may be different for each position. It is necessary to check the distribution of such a transistor and analyze whether there is a defect.

One method of determining whether a transistor is defective is to analyze the characteristic values of the transistor after forming a dummy transistor in the non-display area NDA. However, although the characteristic values of the transistors disposed in the pixel PX may be estimated indirectly only by the characteristic values of the dummy transistor in the non-display area NDA, it is difficult to reflect the variables depending on the position of each pixel PX. In particular, when the substrate SUB includes cut-out portions SLT, the characteristics of transistors around the cut-out portions SLT may vary according to stretching and thus it is difficult to say that the dummy transistor in the non-display area NDA outside the display area DPA shows the same state as the transistors around the cut-out portions SLT.

By disposing a test transistor TRT in an array repeating unit APU, the test transistor TRT may be in substantially the same micro-processing state and stress state as peripheral transistors. Accordingly, the characteristic values of the peripheral transistors (e.g., driving transistors) may be more accurately identified by analyzing the characteristic values of the test transistor TRT. In addition, when the test transistor TRT is provided in various array repeating units APU, the distribution of the transistors for each position may also be accurately analyzed. That is, a short-range uniformity characteristic may be precisely measured.

One test transistor TRT may be disposed for each array repeating unit APU, but the invention is not limited thereto, and two or more test transistors TRT may be disposed for each array repeating unit APU, or the test transistor TRT may also be disposed for each array repeating unit APU disposed at regular intervals among the plurality of array repeating units APU.

The test transistor TRT may be provided not only to be separated from the transistors of the pixel circuit but also to be separated from other lines without being connected to other lines. To this end, the test transistor TRT may be disposed in a first island ISL1 having a relatively great area. In an exemplary embodiment, the test transistor TRT may be disposed above a left protrusion LPT of the first island ISL1, for example, but the invention is not limited thereto.

Figure 16:
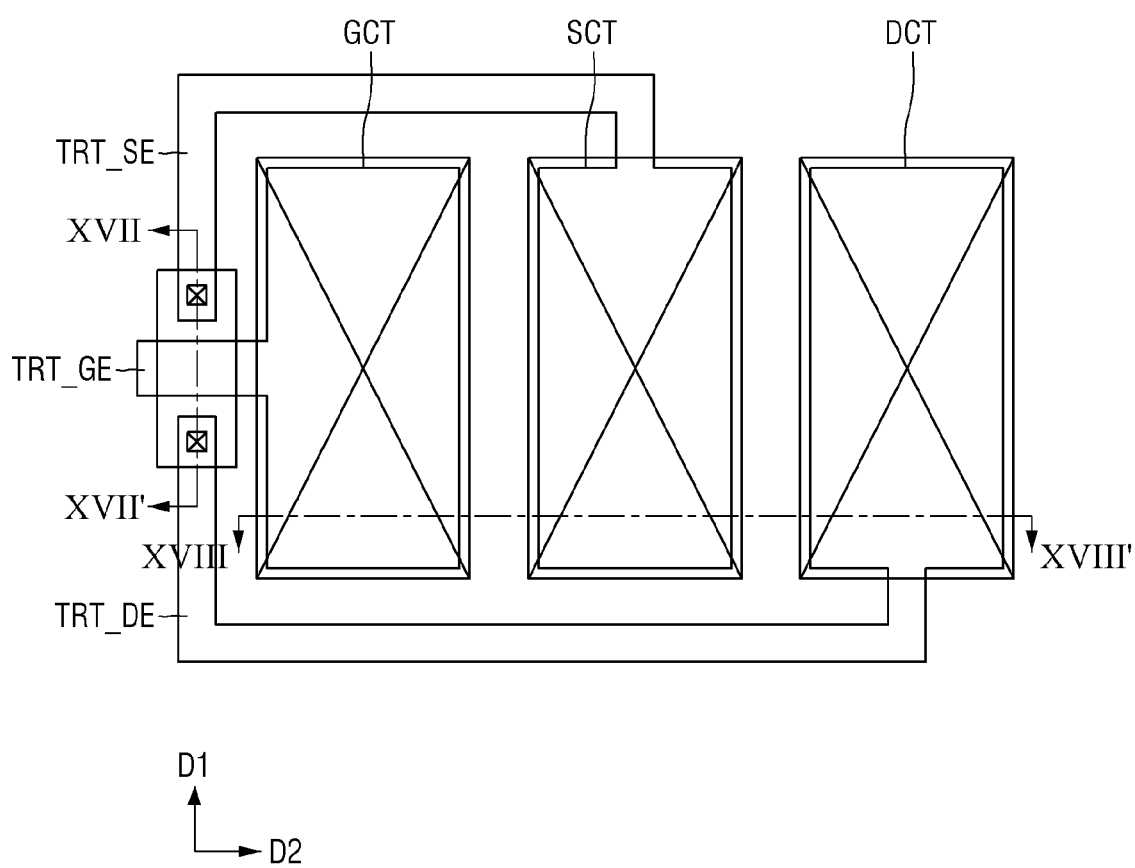
FIG. 16 is an enlarged view of a test transistor of FIG. 15.
Figure 17:
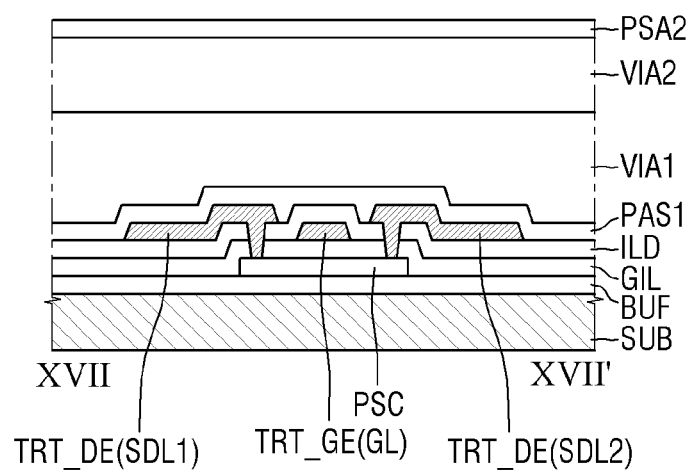
FIG. 17 is a cross-sectional view taken along line XVII-XVII' of FIG. 16.
Figure 18:
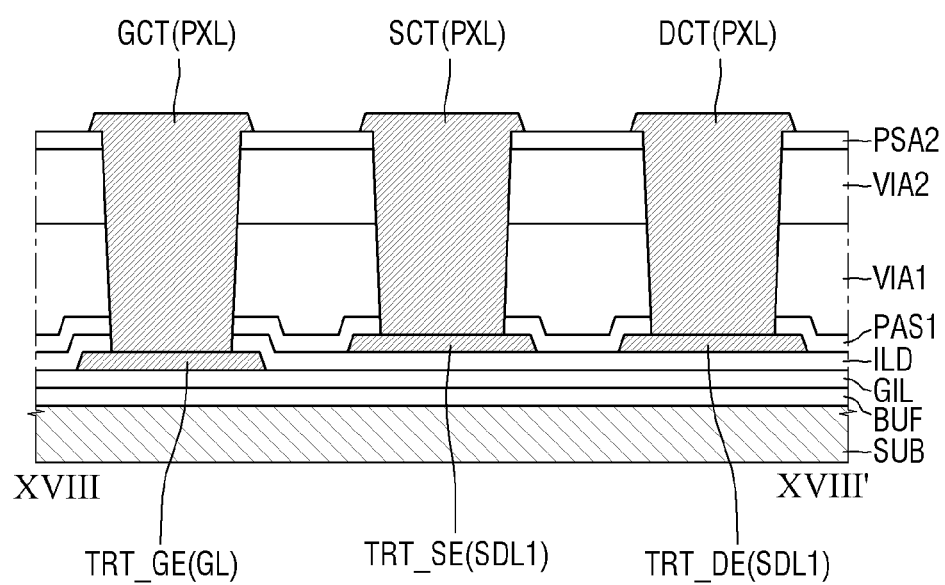
FIG. 18 is a cross-sectional view taken along line XVIII-XVIII' of FIG. 16.

FIG. 16 is an enlarged view of the test transistor of FIG. 15. FIG. 17 is a cross-sectional view taken along line XVII-XVII' of FIG. 16. FIG. 18 is a cross-sectional view taken along line XVIII-XVIII' of FIG. 16.

Referring to FIGS. 16 to 18, the test transistor TRT includes a semiconductor layer PSL, a gate electrode TRT_GE, a first source/drain electrode TRT_SE, and a second source/drain electrode TRT_DE. The test transistor TRT has the same layered structure as that of the transistors of the pixel. The gate electrode TRT_GE may include the gate conductive layer GL described above, and the first source/drain electrode TRT_SE and the second source/drain electrode TRT_DE may include the first source/drain conductive layer SDL1. Each of the gate electrode TRT_GE, the first source/drain electrode TRT_SE, and the second source/drain electrode TRT_DE may include a pad region that extends in one direction and then extends in width. The areas of the pad regions may be the same, but the invention is not limited thereto.

The test transistor TRT may further include a gate contact electrode GCT, a first source/drain contact electrode SCT, and a second source/drain contact electrode DCT. The gate contact electrode GCT, the first source/drain contact electrode SCT, and the second source/drain contact electrode DCT may include a material of the pixel electrode PXL. The gate contact electrode GCT may be electrically connected to the gate electrode TRT_GE through contact holes passing through the second passivation layer PAS2, the second via layer VIA2, the first via layer VIA1, the first passivation layer PAS1, and the interlayer insulating film ILD. The first source/drain contact electrode SCT and the second source/drain contact electrode DCT may be electrically connected to the first source/drain electrode TRT_SE and the second source/drain electrode TRT_DE, respectively, through contact holes passing through the second passivation layer PAS2, the second via layer VIA2, the first via layer VIA1, and the first passivation layer PAS1.

As described above, when the contact electrode of the test transistor TRT is disposed on a top layer and exposed to the outside, the test by bringing the probes into contact may be easily performed. That is, through the probes, a gate on/off voltage may be applied to the gate contact electrode GCT and various test voltages may be applied to the first source/drain contact electrode SCT and the second source/drain contact electrode DCT to measure various characteristic values of the test transistor TRT. As described above, since a signal may be directly applied to each terminal of the test transistor TRT, the characteristic values of the pure test transistor TRT itself may be accurately identified without the influence of the power voltage lines ELVVDDL and ELVSSL or other transistors connected to the test transistor TRT. In addition, as a result, the characteristic values of the transistors around the display area DPA may be accurately estimated, which may be utilized to manage the distribution characteristics of the transistors in the entire display area DPA.

The exemplary embodiments described above may be variously combined. In an exemplary embodiment, the display device may include both the test transistor TRT and the test lines TSL, for example. Specifically, the test transistor TRT and the test lines TSL may be disposed in one array repeating unit APU, and only the test transistor TRT may be disposed in some array repeating units APU, and only the test lines TSL may be disposed in some other array repeating units APU.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
   a substrate in which a cut-out portion is defined; and
   a first conductive layer disposed on the substrate and including a first signal line and a first test line,
   wherein materials constituting the substrate are not present in the cut-out portion,
   a portion of the first test line does not contact the substrate and the portion of the first test line that does not contact the substrate crosses the cut-out portion and overlaps at least a portion of the cut-out portion in a thickness direction, and
   one end portion of the first test line includes a first pad region which is expanded.

2. The display device of claim 1, wherein the substrate includes a plurality of islands divided by the cut-out portion.

3. The display device of claim 2, wherein a pattern in which the plurality of islands is arranged includes array repeating units, and
   the array repeating units are arranged repeatedly along a first direction and a second direction crossing the first direction.

4. The display device of claim 3, wherein the array repeating units include a first array repeating unit and a second array repeating unit adjacent to the first array repeating unit in the first direction or the second direction, and
the second array repeating unit has a line-symmetric shape with respect to the first array repeating unit.

5. The display device of claim 3, wherein at least one first test line is disposed for each of the array repeating units.

6. The display device of claim 3, wherein one or more pixels are disposed in an array repeating unit of the array repeating units.

7. The display device of claim 1, wherein at least a portion of the first signal line crosses the cut-out portion.

8. The display device of claim 1, further comprising a first insulating layer disposed on the first conductive layer, and a second conductive layer disposed on the first insulating layer and including a second signal line and a second test line,
wherein the second test line crosses the cut-out portion, and
one end portion of the second test line includes a second pad region which is expanded.

9. The display device of claim 8, wherein the second conductive layer includes a first contact electrode connected to the first pad region of the first test line by passing through the first insulating layer.

10. The display device of claim 8, further comprising a second insulating layer disposed on the second conductive layer, and a third conductive layer disposed on the second insulating layer and including a third signal line and a third test line,
wherein the third test line crosses the cut-out portion, and
one end portion of the third test line includes a third pad region which is expanded.

11. The display device of claim 10, wherein the third conductive layer includes a first contact electrode connected to the first pad region by passing through the second insulating layer and the first insulating layer, and
a second contact electrode connected to the second pad region by passing through the second insulating layer.

12. The display device of claim 10, further comprising:
a data line through which a data signal is transmitted, a first power voltage line through which a first power voltage signal is transmitted, and a second power voltage line through which a second power voltage signal is transmitted as a pixel circuit provided for each pixel,
wherein
the first signal line includes the data line,
the second signal line includes the first power voltage line, and
the third signal line includes the second power voltage line.

13. The display device of claim 1, wherein the display device is stretchable to be expanded and contracted.

14. A test method of a display device, the method comprising:
forming a first conductive layer including a first signal line and a first test line on a substrate in which a cut-out portion is defined such that a portion of the first test line does not contact the substrate and the portion of the first test line that does not contact the substrate crosses the cut-out portion and the first test line includes a first pad region including one end portion expanded; and
measuring a resistance of the first test line,
wherein materials constituting the substrate are not present in the cut-out portion, and the portion of the first test line that does not contact the substrate overlaps at least a portion of the cut-out portion in a thickness direction.

15. The test method of claim 14, wherein the measuring the resistance of the first test line is performed by contacting a probe.

16. The test method of claim 14, further comprising performing a stretching test on the substrate on which the first conductive layer is provided prior to the measuring the resistance of the first test line.

* * * * *